US006925590B2

(12) United States Patent
Campbell

(10) Patent No.: US 6,925,590 B2
(45) Date of Patent: Aug. 2, 2005

(54) SCAN INTERFACE

(75) Inventor: Brian J. Campbell, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 461 days.

(21) Appl. No.: 10/127,106

(22) Filed: Apr. 22, 2002

(65) Prior Publication Data

US 2003/0200493 A1 Oct. 23, 2003

(51) Int. Cl.[7] .............................................. G01R 31/28
(52) U.S. Cl. ...................................................... 714/726
(58) Field of Search ................................ 714/724, 726, 714/727, 729, 731, 732

(56) References Cited

U.S. PATENT DOCUMENTS

| | | | |
|---|---|---|---|
| 4,061,933 A | | 12/1977 | Schroeder et al. |
| 5,459,736 A | * | 10/1995 | Nakamura ................... 714/731 |
| 5,689,517 A | | 11/1997 | Ruparel |
| 5,748,015 A | | 5/1998 | Tam |
| 5,815,725 A | | 9/1998 | Feierbach |
| 5,831,462 A | | 11/1998 | Witt et al. |
| 5,838,179 A | | 11/1998 | Schmidt |
| 5,870,411 A | | 2/1999 | Durham et al. |
| 6,057,711 A | | 5/2000 | Sessions |
| 6,223,282 B1 | | 4/2001 | Kang |
| 6,247,134 B1 | | 6/2001 | Sproch et al. |
| 6,272,667 B1 | | 8/2001 | Minami et al. |
| 6,297,670 B1 | | 10/2001 | Chao et al. |
| 6,318,911 B1 | | 11/2001 | Kitahara |
| 6,411,152 B1 | | 6/2002 | Dobberpuhl |
| 6,429,689 B1 | | 8/2002 | Allen et al. |
| 6,535,036 B1 | | 3/2003 | Dobberpuhl |
| 6,636,996 B2 | * | 10/2003 | Nowka ........................ 714/727 |

OTHER PUBLICATIONS

Stephany, et al., "FP 15.5: A 200MHz 32b 0.5W CMOS RISC Microprocessor," Digital Semiconductor, Austin, TX, IEEE, 1998, pp. 15.5–1 to 15.5–9.
Santhanam, et al., "SA 18.6: A Low–Cost 300MHz RISC CPU with Attached Media Processor," Digital Equipment Corp., Palo Alto, CA, IEEE, 1998, pp. 18.6–1 to 18.6–9.
Montanaro, et al., "A 160–MHz, 32–b, 0.5–W CMOS RISC Microprocessor," IEEE Journal of Solid–State Circuits, vol. 31, No. 11, Nov. 1996, 12 pages.
Weiss, et al., "The On–Chip 3MB Subarray Based $3^{rd}$ Level Cache on an Itanium Microprocessor," IEEE, ISSCC 2002, Session 6, 3 pages.
Josephson, et al., "Test Methodology for the McKinley Processor," IEEE, ITC International Test Conference, Paper 21.1., 2001, pp. 578–585.
Santhanam, et al., Presentation for: "A 1GHz Power Efficient Single Chip Multiprocessor System For Broadband Networking Applications," Broadcom Corporation, Jun. 14, 2001, 19 pages.
Santanam, et al. "A 1GHz Power Efficient Single Chip Multiprocessor System For Broadband Networking Applications," Broadcom Corporation, Jun. 14, 2001, 4 pages.

* cited by examiner

Primary Examiner—Guy J. Lamarre
Assistant Examiner—James C Kerveros
(74) Attorney, Agent, or Firm—Garlick Harrison & Markison LLP

(57) ABSTRACT

A scan interface for an integrated circuit includes a scan clock and a scan mode signal. The scan mode signal is indicative of whether or not scan is active, and may be used by dedicated scan circuitry in integrated circuit. Such circuitry may be inactive if the scan mode indicates that scan is inactive, and active if the scan mode indicates that scan is active. For example, the scan circuitry may not toggle is scan is inactive. The scan circuitry may present a reduced load to functional circuitry if scan is inactive. In some embodiments, static and dynamic scan circuits are included for use with static and dynamic logic circuits, respectively.

14 Claims, 17 Drawing Sheets

SCAN INTERFACE

BACKGROUND OF THE INVENTION

1. Field of the Invention

This invention is related to the field of scan testing of integrated circuits.

2. Description of the Related Art

Over time, larger numbers of transistors have been integrated into integrated circuits. As more transistors can be integrated, the functionality that can be realized in a given integrated circuit increases. The complexity of the integrated circuit similarly increases, and thus the ability to test the circuitry to ensure that it is functioning properly remains an important issue.

One mechanism used to test integrated circuits is scan testing (or, more briefly, "scan"). To support scan testing, various state elements (e.g. flops, latches, registers, etc.) are typically coupled together in a "scan chain". The state elements may include separate scan-in inputs and/or scan-out outputs which may be connected together to form a scan chain. Alternatively, additional circuitry may mux the scan-in and functional inputs to the input of the state element and the output of the state element may be used for both scan values and functional values. Scan data is shifted into the scan chain, thus loading the state elements with a desired set of test data. The circuitry may be clocked functionally for one or more clock cycles, and then the result data may be shifted out of the scan chain. The result data may be compared to expected data to detect defects or improper operation.

Implementing scan circuitry in an integrated circuit includes a certain amount of overhead, and so in many cases a design decision is made as to how many of the state elements are scannable (e.g. how many state elements include corresponding scan circuitry). If state elements are implemented without scan circuitry, the test coverage that can be achieved using scan is reduced.

The overhead can be manifest in several ways. For example, the area occupied by the scan circuitry may be relatively large. In one prior art method, the scan chain is implemented as a separate set of master/slave latches (clocked by separate master and slave scan clocks). Once the scan data is scanned into the scan chain, the scan data may be loaded in parallel into the corresponding state elements.

In some cases, the overhead may include additional load presented on state elements and related circuitry by the scan circuitry. The additional load can slow down the functional (non-scan) circuitry, reducing the cycle times achievable in the integrated circuit. In low power designs (in which reducing power consumption of the integrated circuit is considered a priority), the power consumed by the scan circuitry (even when scan is not active) may also be considered overhead.

SUMMARY OF THE INVENTION

In one embodiment, an integrated circuit includes at least one static logic scan circuit and at least one dynamic logic scan circuit. The static logic scan circuit is coupled to receive a scan mode signal indicative of whether or not scan is active, and is coupled between an output of a first static storage device and a first scan-in input of a second static storage device. The static logic scan circuit is configured to prevent a race condition from the output to the first scan-in input responsive to the scan mode signal indicating that scan is active. Additionally, the static logic scan circuit is inactive responsive to the scan mode signal indicating that scan is inactive. The dynamic logic scan circuit is coupled to receive the scan mode signal, a scan clock signal, and a scan-in input. Furthermore, the dynamic logic scan circuit is coupled to an internal node of a dynamic logic circuit. The dynamic logic scan circuit is configured to provide the scan-in input onto the internal node and to retain the scan-in input on the internal node responsive to the scan clock signal and the scan mode signal indicating that scan is active. The dynamic logic scan circuit is inactive responsive to the scan mode signal indicating that scan is inactive. Other embodiments are contemplated which include only the static scan circuit and only the dynamic scan circuit.

In another embodiment, an integrated circuit has a scan interface, the scan interface consisting of a scan mode signal provided on a scan mode pin of the integrated circuit, a scan in signal provided on a scan in pin of the integrated circuit, a scan out signal provided on a scan out pin of the integrated circuit, and a scan clock signal provided on a scan clock pin of the integrated circuit. Dedicated scan circuits within the integrated circuit are coupled to receive the scan mode signal and, responsive to a state of the scan mode signal indicating that scan is inactive, the dedicated scan circuits are inactive. Responsive to the state of the scan mode signal indicating that scan is active, the dedicated scan circuits are active. The scan in signal is for providing scan data to the integrated circuit, and the scan out signal is for providing scan data from the integrated circuit. The scan clock is separate from a functional clock provided to the integrated circuit, and state elements within the integrated circuit are configured to capture scan values responsive to the scan clock signal.

A circuit is contemplated, comprising a dynamic logic circuit and a scan circuit coupled thereto. The dynamic logic circuit has an internal node on which the dynamic logic circuit generates a dynamic signal and a logic circuit coupled to the internal node. The logic circuit generates an output signal on an output node of the dynamic logic signal responsive to the dynamic signal. Coupled to the internal node of the dynamic logic circuit, the scan circuit is configured to provide a scan data on the internal node and retain the scan data on the internal node responsive to a scan mode signal indicative of whether or not scan is active.

A method is also contemplated. A scan mode signal is asserted to indicate that scan is active. Dedicated scan circuitry is inactive in response to the scan mode signal being deasserted and active responsive to the scan mode signal being asserted. Data is scanned through the dedicated scan circuits and static or dynamic circuits to which the dedicated scan circuits are coupled responsive to a single scan clock signal.

BRIEF DESCRIPTION OF THE DRAWINGS

The following detailed description makes reference to the accompanying drawings, which are now briefly described.

Figure 1:
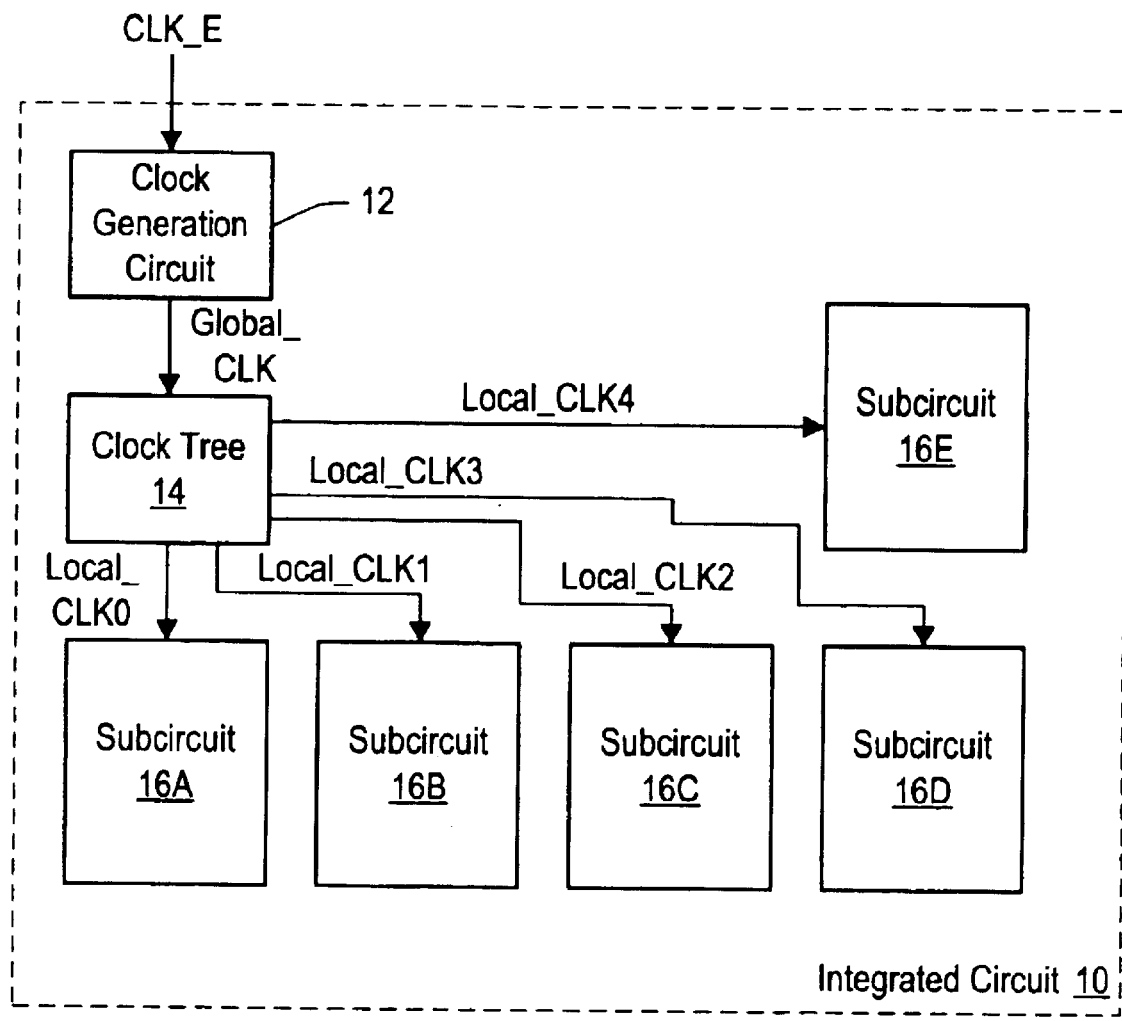
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Conditional Clocking

Turning now to FIG. 1, a block diagram of one embodiment of an integrated circuit 10 is shown. Other embodiments are possible and contemplated. In the embodiment of FIG. 1, the integrated circuit 10 includes a clock generation circuit 12, a clock tree 14, and a plurality of subcircuits 16A–16E. The clock generation circuit 12 is coupled to receive an external clock (CLK_E) and generate a global clock (Global_CLK) therefrom. The clock tree 14 is coupled to receive the global clock and to provide various local clocks (e.g. Local_CLK0, Local_CLK1, Local_CLK2, Local_CLK3, and Local_CLK4 to subcircuits 16A–16E, respectively).

The clock generation circuit 12 is configured to generate the global clock Global_CLK from the external clock CLK_E for use by the circuitry illustrated in FIG. 1. The clock generation circuit 12 may include, for example, a phase locked loop (PLL) for locking the phase of the global clock to the external clock. The PLL or other clock generation circuitry may multiply or divide the frequency of the external clock to arrive at the frequency of the global clock. Any desired clock generation circuitry may be used.

The global clock is provided to the clock tree 14. The clock tree 14 buffers the global clock for distribution to the various loads in the integrated circuit 10 (e.g. the various subcircuits 16A–16E). Any buffer network may be used, as desired. In one embodiment, the clock tree is an H-tree design, although other clock tree designs such as grids may be used. While illustrated in FIG. 1 as a block providing local clock signals for convenience in the drawing, it is understood that the buffer circuitry forming the clock tree 14 may generally be distributed throughout the silicon area occupied by the integrated circuit 10. The buffer network design may attempt to approximately match the delay from the global clock to the various local clock signals. Generally, as used herein, a clock tree is any buffer network for buffering an input clock to produce local clocks for various circuitry. As will be illustrated in FIG. 2 below, the clock tree 14 may include conditional clock buffers for conditionally generating the local clocks (e.g. for power savings reasons).

The subcircuits 16A–16E may generally provide the functionality that the integrated circuit 10 is designed to perform. For example, if the integrated circuit 10 includes a processor, subcircuits may include fetch logic, issue logic, and execution units of various types (e.g. integer, floating point, load/store, etc.). The integrated circuit 10 may include various interface circuits (e.g. network interfaces, standard I/O interfaces such as peripheral component interconnect (PCI), HyperTransport™, etc.); and each interface circuit may comprise one or more subcircuits. The integrated circuit 10 may include caches or cache controllers, which may comprise one or more subcircuits, and/or a memory controller which may comprise one or more subcircuits. Any functionality may be included in various embodiments.

While the subcircuits 16A–16E each receive a local clock in FIG. 1, a given subcircuit may receive multiple local clocks. The local clocks may be conditionally generated the same way (e.g. they may be provided for electrical loading purposes), or may be separately conditionally generated. The number of subcircuits may vary from embodiment to embodiment as well.

Figure 2:
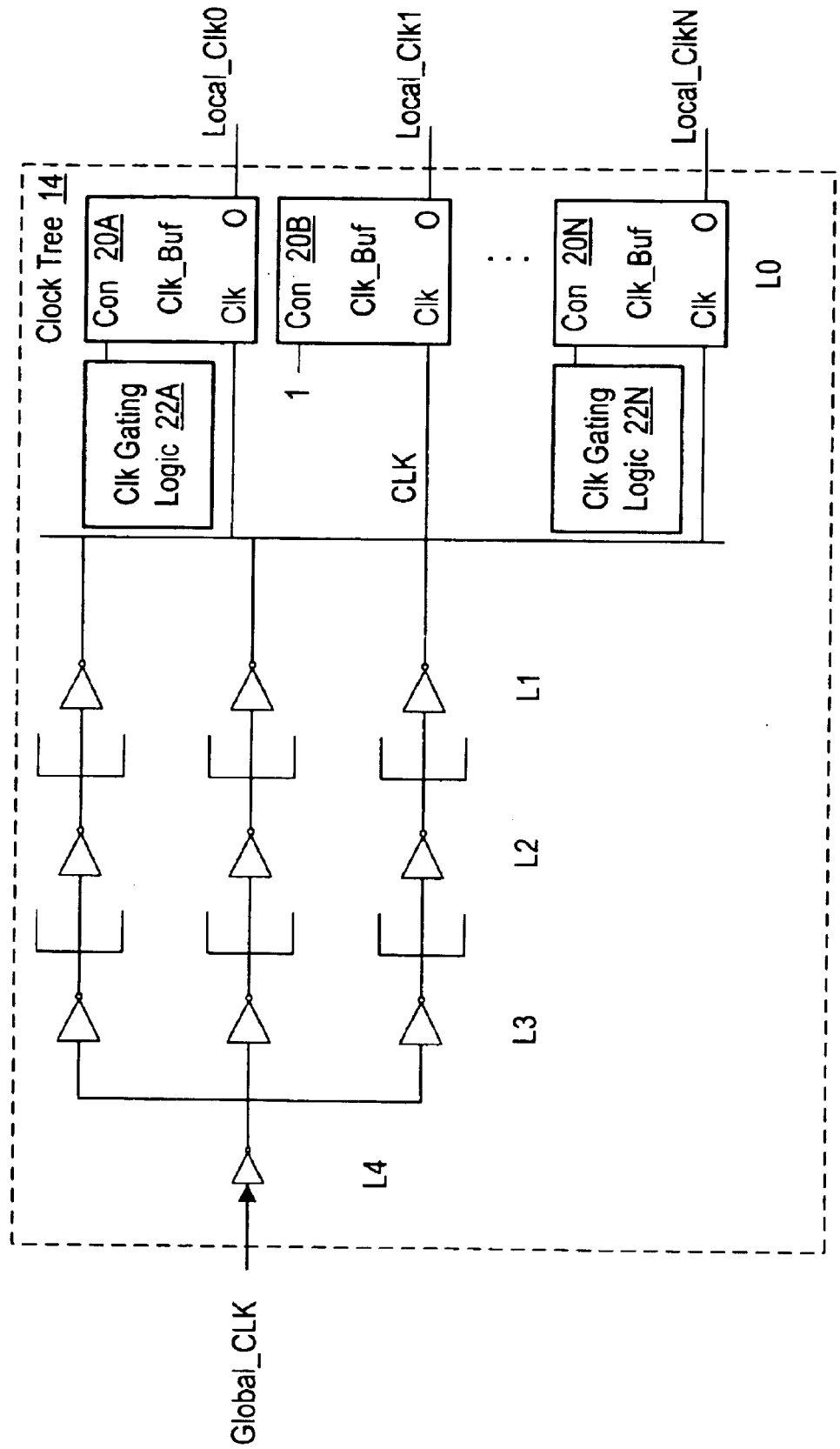
FIG. 2 is a circuit diagram of one embodiment of a clock tree.

Turning now to FIG. 2, a circuit diagram illustrating one embodiment of the clock tree 14 which may be employed in one embodiment of the integrated circuit 10 is shown. Other embodiments are possible and contemplated. In the embodiment of FIG. 2, the clock tree 14 includes several levels of buffers (labeled L0–L4 in FIG. 2, with L0 being the lowest level at which the local clocks are generated and provided to subcircuits 16A–16E). Each level of buffers is coupled to the next higher level of buffers. In the illustrated embodiment, each of the levels L1–L3 comprises inverter circuits, although non-inverting buffer circuits may be used in other embodiments. Level L0 comprises conditional clock buffer circuits (e.g. circuits 20A–20N illustrated in FIG. 2) coupled to the output of the L1 level. In the illustrated embodiment, the outputs of the L1 buffers are connected together, although other embodiments may connect individual L1 buffer outputs to clock inputs of various conditional clock buffer circuits 20A–20N.

At each level of buffering, a given buffer may be coupled to some number of buffers at the next lower level. The fan-out from a given buffer may depend on the characteristics of the transistors in the semiconductor technology used, the delay associated with wire resistance and capacitance, etc. Generally, at some number of fan-out, insertion of a buffer may result in reduced delay overall rather than allowing a higher fan out. For example, a fan out of around 3 may be provided between buffer levels. Any fan out may be used in other embodiments. For example, a fan out of 4 or 5, or 2, may be selected in other embodiments.

The conditional clock buffer circuits 20A–20N may generate the local clock signals conditionally based on a condition input (Con in FIG. 2). The condition input may be generated by observing various activity in the corresponding subcircuit 16A–16E, and by generating the condition input for the corresponding conditional clock buffer circuits 20A–20N based on whether or not the corresponding subcircuit is to be in use in the next clock cycle. For example, clock gating logic 22A may be coupled to provide the condition input to the conditional clock buffer circuit 20A, and clock gating logic 22N may be coupled to provide the condition input to the conditional clock buffer circuit 20N. Other local clocks may be unconditional. For example, the conditional clock buffer circuit 20B has its condition input tied to a logical one (indicating that the Local_CLK1 is to be generated unconditionally in this example). The conditional clock buffer circuitry is still used in this case to minimize delay differences between the unconditional local clocks and the conditional local clocks. In other embodiments, the conditional clock buffer circuit may not be used for unconditional clocks.

In the illustrated embodiment, the condition signal is a logical one if clock generation is desired for the corresponding local clock and is a logical zero if clock generation is not desired (e.g. the clock is to be "gated"). This example may be used in some of the figures described below. In other embodiments, the condition signal may be a logical zero if clock generation is not desired and a logical one of clock generation is desired. The condition signal may be referred to as "asserted" if it is in a state indicating that clock generation is desired, and "deasserted" if it is in a state indicating that clock generation is not desired. As used herein, a clock is "generated" if the clock oscillates in response to the source clock and is "not generated" if the clock is held at a steady level (high or low).

While the embodiment shown in FIG. 2 includes the conditional clock buffer circuits at the lowest level (L0) of the local clock tree, other embodiments may include additional levels of buffering below the conditional clock buffer level. It is noted that, while conditional clocking is implemented at one level in FIG. 2, other embodiments may implement additional conditional clocking at one or more coarser levels than that shown in FIG. 2. For example, the global clock may be qualified with one or more condition signals at the L4 level to gate the global clock, thus indirectly gating all of the local clocks shown in FIG. 2. Conditional clocking may be implemented in any number of levels.

It is noted that, in other embodiments, the number of levels in the clock tree may vary. The number of levels may be more or less than that shown in the example of FIG. 2.

Figure 3:
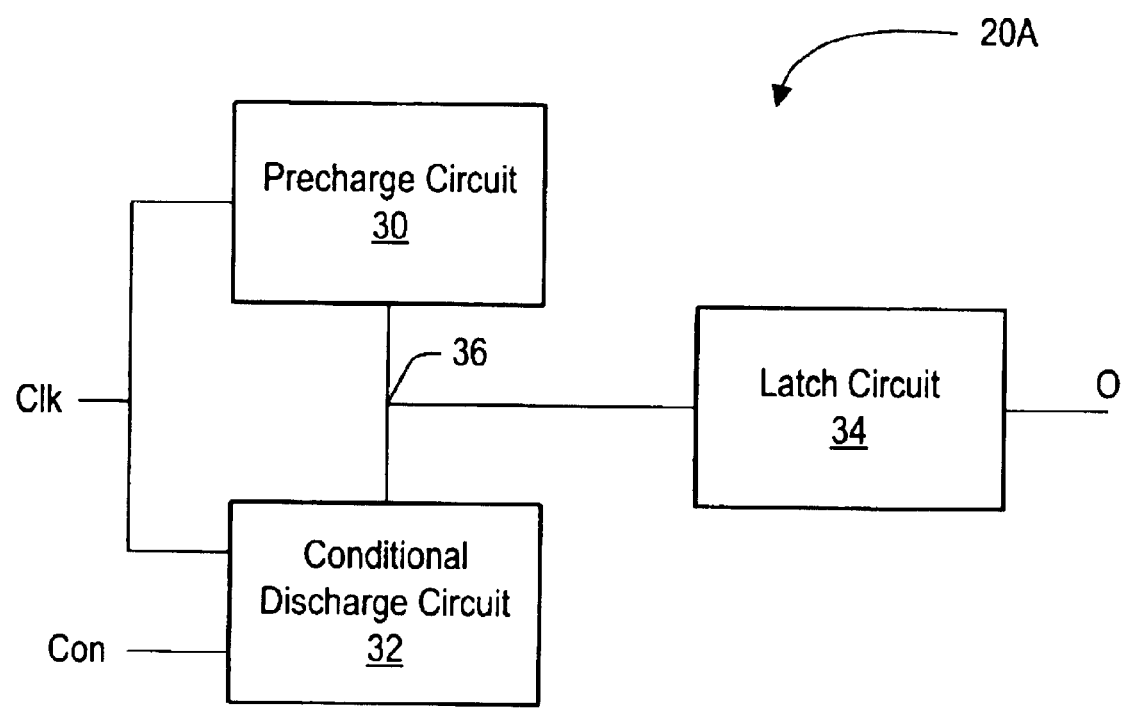
FIG. 3 is a block diagram of one embodiment of a conditional clock buffer circuit.

Turning now to FIG. 3, a block diagram is shown of one embodiment of the conditional clock buffer circuit 20A. Other clock buffer circuits 20B–20N may be similar. Other embodiments are possible and contemplated. Inputs and outputs of the conditional clock buffer circuit 20A are labeled in FIG. 3 similar to the labeling shown in FIG. 2 (Clk, Con, and O). The conditional clock buffer circuit 20A includes a precharge circuit 30, a conditional discharge circuit 32, and a latch circuit 34. The precharge circuit 30 is coupled to receive the input clock Clk and is coupled to a node 36. The conditional discharge circuit is coupled to receive the input clock Clk and the condition signal Con, and is coupled to the node 36. The latch circuit 34 is coupled between the node 36 and the output O.

Generally, the precharge circuit 30 precharges the node 36 responsive to one phase of the clock Clk. The conditional discharge circuit 32 conditionally discharges the node 36 during a first portion of a second phase of the clock Clk, dependent on the state of the condition signal during the first portion (referred to below as the condition window). If the condition signal is asserted in the condition window, the conditional discharge circuit 32 discharges the node 36 and the output clock O is generated for that clock cycle of the clock Clk. If the condition signal is deasserted in the condition window, the conditional discharge circuit 32 does not discharge the node 36 and the output clock O is not generated for that clock cycle of the clock Clk (i.e. the clock is gated for that clock cycle).

The condition window may be of any desired width, and may occupy any portion of the second phase of the clock Clk. In one embodiment, the first phase is the low phase of the clock Clk and the second phase is the high phase of the clock Clk. The condition window may begin at the rising edge of the clock Clk (the beginning of the high phase) and may continue for a predetermined length of time. For example, in one implementation, the condition window may be about ¼ of the phase of the clock Clk. In another implementation, the condition window may be about two gate delays in the integrated circuit. As used herein, a "gate delay" is the delay from a change in an input of a predetermined logic gate to a corresponding change in the output of that logic gate. For example, the predetermined logic gate may be an inverter having a fan out of four inverters of the same size. The delay may be measured from any desired points in the transition of the input and output of the predetermined logic gate. For example, the delay may be measured from the 50% point in the transition of the input to the 50% point in the corresponding transition of the output. The gate delay may generally depend on the semiconductor fabrication technology used to fabricate the integrated circuit 10.

Since the conditional discharge circuit 32 operates during the condition window to either discharge or not discharge the node 36, the setup and hold times for the condition signal may be relative to the condition window. The total time that the condition signal remains valid (setup time and hold time) may be relatively short (e.g. approximately the length of the condition window, or less in some cases). Thus, the design of the clock gating logic 22A–22N may be simplified. In some cases, the clock gating logic 22A–22N may be more sophisticated, using the additional available time to calculate more complex clock gating algorithms. Additionally, since the condition signal may affect the output clock O during the condition window only, noise effects on the condition signal may be lessened in some implementations.

In some cases, the setup time with respect to the rising edge of the clock Clk may be negative (that is, the condition signal may be at a valid level subsequent to the rising edge of the clock Clk and still cause proper operation). Generally, the conditional signal may be asserted long enough, during the condition window, to discharge the node 36 (or may remain deasserted long enough during the condition window to ensure that the output clock O is not generated during the clock cycle). Once the condition window has passed, the condition signal may change state without affecting the output clock O.

In the illustrated embodiment, the latch circuit 34 latches the value driven on the node 36 and provides the output clock O. The latch circuit 34 may ensure that the output clock O is actively driven (i.e. not floating) at all times. Particularly, during the remaining portion of the second phase, outside of the condition window, the latch circuit 34 may actively drive the value resulting from the conditional discharge of the node 36. As used herein, a latch circuit is any circuit which captures an input value and holds a corresponding output value until the input value is actively driven again. The latch circuit may be inverting, in which the output value has the opposite binary sense of the input value, or non-inverting.

In another embodiment, the conditional clock buffer circuit 20A may conditionally precharge the node 36 during the condition window of one clock phase and discharge the node 36 responsive to the other clock phase. Generally, the conditional clock buffer circuit 20A may generate one state of the output clock (high or low) responsive to a phase of the input clock and may conditionally generate the other state based on the condition signal during the condition window.

Figure 4:
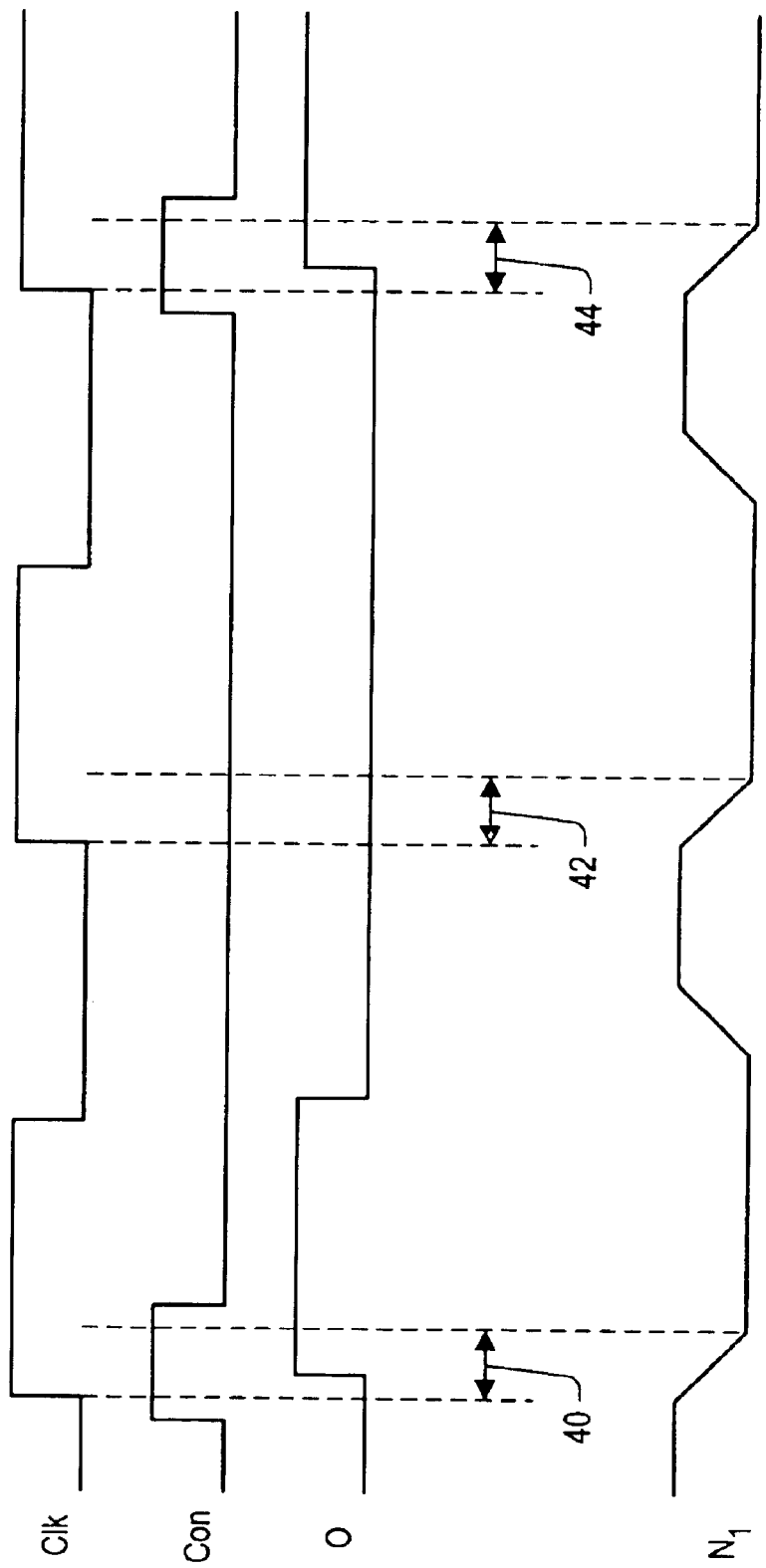
FIG. 4 is a timing diagram illustrating operation of one embodiment of the conditional clock buffer circuit shown in FIG. 3.

FIG. 4 is a timing diagram illustrating operation of one embodiment of the conditional clock buffer circuit 20A. The inputs and output of the clock buffer circuit 20A (Clk, Con, and O) are shown in FIG. 4, as well as the condition window for each clock cycle of the clock Clk. A node N1 is also illustrated in FIG. 4, which is discussed below with regard to FIG. 5.

Two clock cycles of the clock Clk are illustrated in FIG. 4 (and a portion of a third clock cycle is also illustrated). In each clock cycle, a condition window is shown, delimited by vertical dashed lines and illustrated by arrows 40, 42, and 44, respectively. In the first and third clock cycles, the conditional signal Con is asserted (high in this example) during the condition windows 40 and 44, and thus the output clock O is generated in the first and third clock cycles. The output clock O is shown in FIG. 4 slightly delayed from the clock Clk to account for the operation of the conditional clock buffer 20A.

On the other hand, the condition signal is deasserted during the condition window 42, corresponding to the second clock cycle. Accordingly, the output clock O is not generated during the second clock cycle. The output clock O remains constant during the second clock cycle (low in this example).

Figure 5:
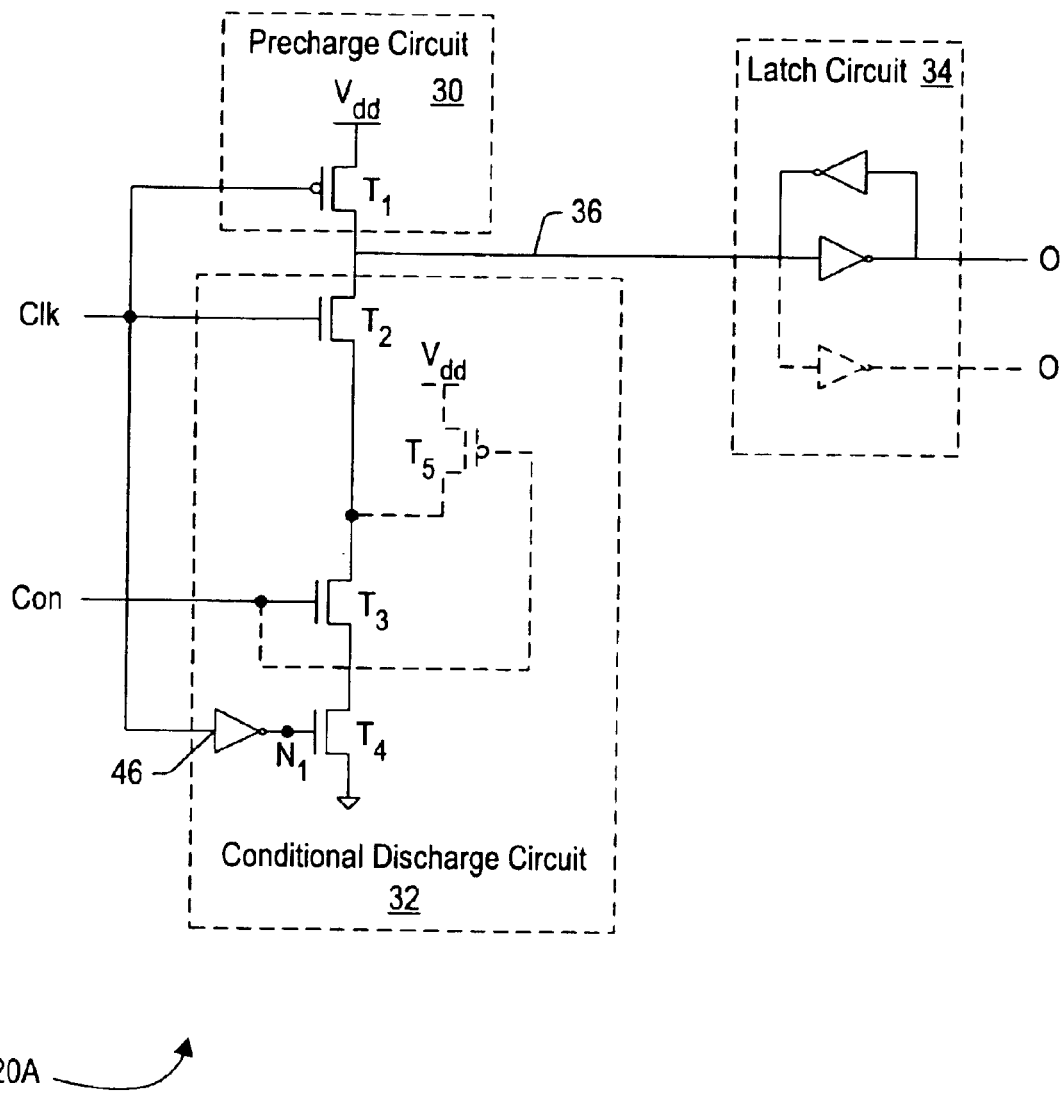
FIG. 5 is a circuit diagram of one embodiment of the conditional clock buffer circuit.

Turning next to FIG. 5, a circuit diagram of one embodiment of the conditional clock buffer circuit 20A is shown. Other conditional clock buffer circuits 20B–20N may be similar. Other embodiments are possible and contemplated. In the embodiment of FIG. 5, the conditional clock buffer circuit 20A includes transistors T1, T2, T3, and T4. The transistor T1 has a source node coupled to the power supply ($V_{dd}$), a drain node connected to the drain node of the transistor T2, and a gate node coupled to receive the clock Clk. The transistors T2, T3, and T4 may be a series connection of transistors. The transistor T2 has a source node connected to the drain node of the transistor T3 and a gate node coupled to receive the clock Clk. The transistor T3 has a source node connected to the drain node of the transistor T4 and a gate node coupled to receive the condition signal Con. The transistor T4 has a source node coupled to ground and a gate node connected to the node N1, which is connected to the output of an inverter 46. The transistor T1 forms the precharge circuit 30 in this embodiment. The transistors T1–T4 (and optionally T5, as described below) and the inverter 46 form the conditional discharge circuit 32 in this embodiment. In the illustrated embodiment, the latch circuit 34 comprises a pair of cross-coupled inverters (and may include an optional additional inverter, as described below).

During the low phase of the clock Clk, the transistor T1 activates and precharges the node 36 to a high voltage. The latch circuit captures the state of node 36, and drives a corresponding low voltage on the output clock O. In response to the rising edge of the clock Clk, the transistor T1 deactivates and the transistor T2 activates. Prior to the inverter 46 responding to the rising edge of the clock Clk, the node N1 is high (from the previous low phase of the clock Clk), and thus the transistor T4 is active also. If the condition signal is asserted, the transistor T3 is active and the series connection of transistors T2–T4 discharges the node 36. If the condition signal is not asserted, T3 is inactive and the node 36 remains charged. Once the inverter 46 responds to the rising edge of the clock Clk, the transistor T4 deactivates, closing the condition window. The latch circuit 34 captures and retains the state of the node 36 for the remainder of the high phase of the clock Clk.

As mentioned above, in response to the rising edge of the clock Clk, the inverter 46 transitions the node N1 low and deactivates the transistor T4. More particularly, as the inverter 46 begins driving the node N1 low, the voltage difference between the gate node and the source node of the transistor T4 drops below the threshold voltage for the transistor T4, and T4 deactivates. For the remainder of the high phase of the clock Clk (after the node N1 transitions low), changes in the condition signal do not affect the state of the node 36. The node 36 either remains charged or has been discharged, dependent on the state of the condition signal during the condition window. In this embodiment, the condition window is defined by the rising edge of the clock Clk and the transition of the signal on the node N1 low. Referring back to FIG. 4, the node N1 is illustrated. The condition windows 40, 42, and 44 end when the node N1 is low (or nearly low), as illustrated by the second dashed vertical line defining each condition window.

The delay provided by the inverter 46 controls the width of the condition window for the embodiment of FIG. 5. The transistors forming the inverter 46 may be sized to generate the desired width. For example, in one implementation, the inverter 46 may be sized to generate two gate delays of delay from the rising edge of the clock Clk to the deactivation of the transistor T4. In another implementation, the inverter may be sized to produce a delay of about ¼ clock phase. In yet another implementation, the inverter may be sized about a factor of 10 or less smaller than other inverters used in the integrated circuit 10.

During the low phase of the clock Clk, the transistor T2 is inactive and the transistor T4 is active. If the condition signal is asserted during this time, the transistor T3 activates. The series connection of the transistors T3 and T4 may discharge the node between the transistors T3 and T2. If the condition signal is not asserted during the following condition window, when the transistor T2 is active, the node 36 may experience charge sharing with the node between transistors T3 and T2. The charge sharing may cause a temporary glitch on the node 36 before the feedback inverter in the latch circuit 34 (which may be relatively weak to allow the transistor T1 and the series connection of transistors T2–T4 to overdrive it) restores the voltage on the node 36. The transistor T5 may be optionally included to address the charge sharing. The transistor T5 has a source node coupled to the power supply, a drain node connected to the node between the transistors T3 and T2, and a gate node coupled to receive the condition signal. If the condition signal is deasserted, the transistor T5 activates and charges the node between the transistors T2 and T3, thus reducing (or possibly eliminating) charge sharing with the node 36 while the transistor T2 is active and the transistor T3 is inactive.

The optional additional inverter may be added to the latch circuit 34, with the output clock O being driven by the additional inverter instead of one of the cross coupled inverters forming the latch. The additional inverter may provide additional noise sensitivity reduction in some embodiments. Since the input of the feedback inverter of the latch circuit 34 is not exposed to noise on the output clock O wires, noise on those wires may be less likely to affect the state of the node 36.

The embodiment of the conditional clock buffer circuit 20A shown in FIG. 5 may be suitable for adding testability features (e.g. scan testing features). For example, by adding a PMOS transistor to the node 36, with its gate node coupled to receive test signals, the output clock may be driven low for test purposes. Similarly, by adding an NMOS transistor to the node 36, the output clock may be driven high for test purposes. The latch circuit 34 may hold the test value after the added transistors are deactivated, which may simplify scan control. Additional transistors may be added to generate other test wave forms on the output clock (e.g. FIGS. 13 and 16 below).

It is noted that the order of the series connection of transistors T2–T4 shown in FIG. 5 may be varied. The transistors may be arranged in any order in other embodiments (with the gate terminals of each transistor still coupled to the same input signals as shown in FIG. 5). For example, the transistor T4 may be at the "top" of the series connection (where transistor T2 is in FIG. 5), with its gate node still coupled to the node N1; the transistor T2 may be in the "middle" of the series connection (where the transistor T3 is in FIG. 5), with its gate node coupled to receive the clock Clk; and the transistor T3 may be at the "bottom" of the series connection (where the transistor T4 is in FIG. 5), with its gate node coupled to receive the condition signal. Other orders are also possible.

In the illustrated embodiment, transistors T1 and T5 are p-type metal-oxide-semiconductor (PMOS) transistors and transistors T2, T3, and T4 are n-type MOS (NMOS) transistors. Other transistors may be used in other embodiments. Generally, a transistor may be any device having at least a first node, a second node and a control node. The conduction between the first node and the second node is controlled via the control node. A transistor is active, or on, if it is conducting and is inactive, off, or deactivated if it is not conducting.

In other embodiments, the condition window can be moved with respect to the rising edge of the clock Clk by buffering the clock Clk at the input of the conditional discharge circuit 32. The condition window may thus be placed any where within the high phase of the clock Clk, as desired. It is noted that the complimentary circuit may also be used (e.g. the transistors T2–T4 may be PMOS and the transistor T1 may be NMOS) in other embodiments.

It is noted that, in some embodiments, the inverter 46 may be replaced by any logic circuitry which inverts the clock Clk. For example, any odd number of inverters coupled in series may be used. Additionally, a NAND or NOR gate may be used (e.g., see FIG. 16).

Scan Interface

Figure 6:
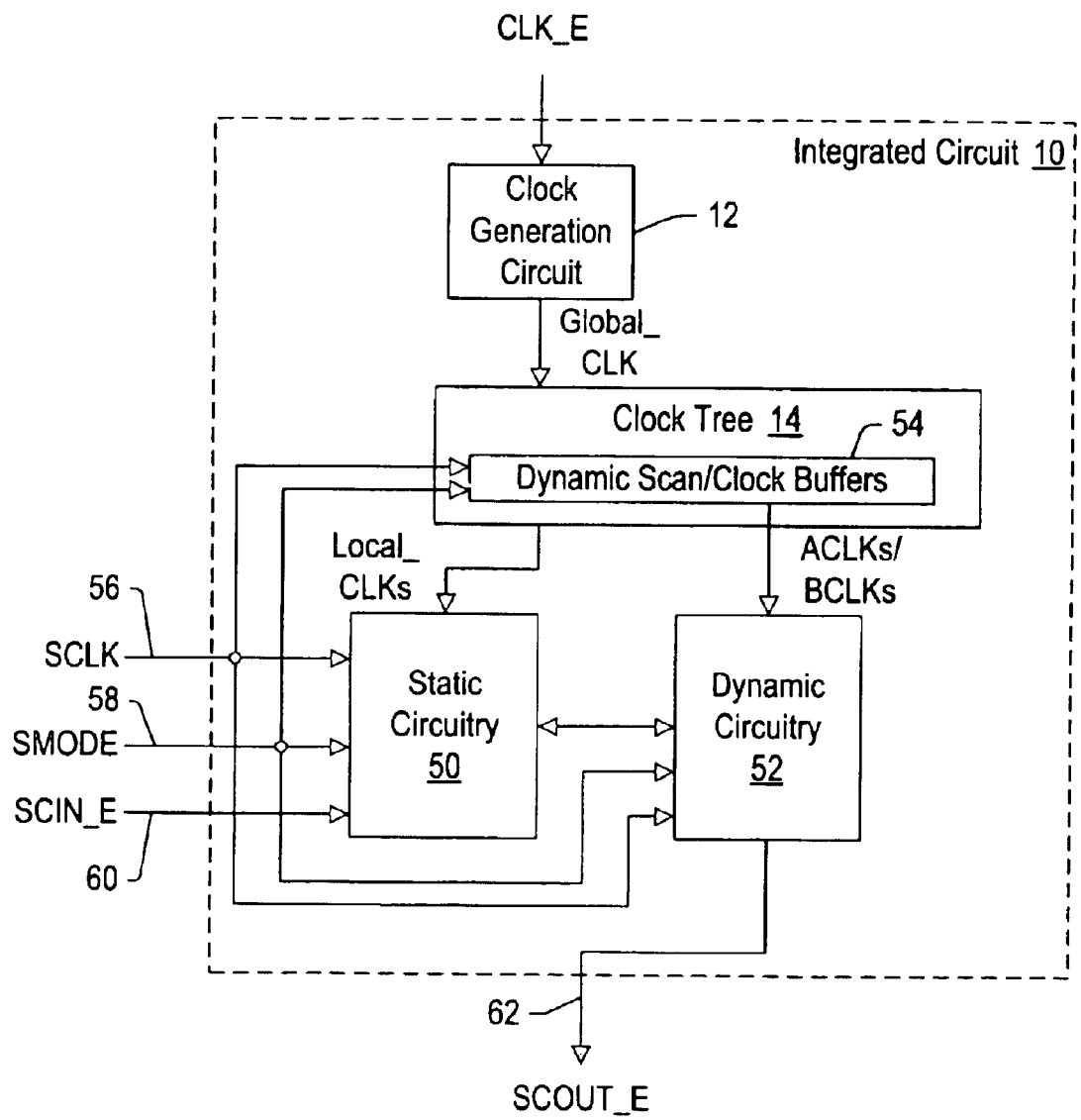
FIG. 6 is a block diagram of one embodiment of an integrated circuit including scan support.

Turning now to FIG. 6, a block diagram of a second embodiment of the integrated circuit 10 is shown. Similar to the embodiment of FIG. 1, the embodiment of FIG. 6 may include the clock generation circuit 12 receiving the external clock CLK_E and generating the global clock Global_CLK for the clock tree 14. The clock tree 14 may generate local clocks for the static circuitry 50 shown in FIG. 6, and may generate clocks for the dynamic circuit 52 shown in FIG. 6 (ACLKs and BCLKs as shown in FIG. 6). More particularly, the clock tree 14 may include various conditional clock buffer circuits for generating the local clocks for the static circuitry 50 (e.g. similar to the above discussion) and may also include dynamic scan/clock buffers 54 for generating the clocks for the dynamic circuitry 52. The static circuitry 50 may be coupled to receive various scan interface signals (e.g. a scan clock SCLK on a first pin 56 of the integrated circuit 10, a scan mode signal SMODE on a second pin 58 of the integrated circuit 10, and a scan in signal SCIN_E on a third pin 60 of the integrated circuit 10). The scan interface may also include a scan out signal SCOUT_E on a fourth pin 62 of the integrated circuit 10. The dynamic circuitry 52 and the dynamic scan/clock buffers 54 are coupled to receive the scan clock and scan mode signals as well. In the illustrated embodiment, the dynamic circuitry is coupled to the scan out signal SCOUT_E. The static circuitry 50 is coupled to the dynamic circuitry 52.

The integrated circuit 10 may support scan testing of both the static circuitry 50 and the dynamic circuitry 52. In general, "scan testing" or "scan" refers to loading test data (also referred to as scan data) into state elements in the circuits being tested, capturing the outputs of the circuits being tested in response to the scan data (typically by clocking the circuits being tested one or more times using the functional clock(s) to those circuits), and scanning the captured output data out of the state elements in the circuits being tested. The captured output data may be used for comparison with expected output data to detect if the circuits being tested are operating properly. As used herein, scan may be referred to as "active" if the scan signals are being used to control the integrated circuit 10 (e.g. data is either being scanned in or out, or the integrated circuit is being prepared to scan in or scan out data). Scan is "inactive" if the scan signals are not being used to control the integrated circuit 10.

Typically, one or more scan chains are defined for the state elements. The scan chains are serial connections corresponding to the state elements. The scan in input may be coupled to the first element in the scan chain, and the scan out output may be coupled to the last element in the scan chain. The order of elements in the scan chain is the order that the scan data is provided on the scan in input as the data is scanned in and the order that scan data is expected on the scan out output.

In the illustrated embodiment, the scan interface supported by the integrated circuit 10 includes (in addition to the scan in and scan out signals): the scan clock SCLK and the scan mode signal SMODE. The scan clock signal is used to control the serial scanning of scan data into and out of the scan chain. Each period of the scan clock signal causes the data in the scan chain to be shifted by one position in the chain. The scan mode signal is used to indicate whether or not scan is active. In some embodiments, the scan mode signal is used to control whether or not certain dedicated scan circuits operate. That is, if scan is active, the dedicated scan circuits operate and if scan is inactive, the dedicated scan circuits do not operate. By preventing the dedicated scan circuits from operating, power may be conserved (since the dedicated scan circuits are not toggling) and/or the load presented by the dedicated scan circuits on related functional circuitry may be reduced (by isolating the dedicated scan circuitry from the functional paths).

A relatively small number of control signals are used in the illustrated embodiment: one scan clock and one scan mode signal. The interface may provide a relatively simple control mechanism for scan operation, and its impact on the number of pins employed by the integrated circuit 10 may be relatively small.

Prior to activating scan, the external clock CLK_E may be stopped, thus resulting in the stopping of the local clocks (Local_CLKs, ACLKs, and BCLKs; although the ACLKs and BCLKs may be generated from the scan interface signals as well, in some embodiments). Alternatively, the scan mode signal may be used, in some embodiments, to gate the local or global clocks. Thus, when scanning is to be started, the static circuitry 50 and the dynamic circuitry 52 may be idle.

The scan clock and scan mode signals are provided directly to the static circuitry 50 and the dynamic circuitry 52 in the illustrated embodiment. In the static circuitry 50, various static storage devices may be clocked by the scan clock for scanning purposes (as well as by a local clock for functional purposes). The static storage devices are coupled into a scan chain (along with the dynamic circuitry 52 as discussed below) and may have scan data stored therein when scan is active. In the dynamic circuitry 52, storage devices and/or dynamic circuits may be coupled into the scan chain and may have scan data stored therein when scan is active (responsive to the scan clock and scan mode signals).

In the illustrated embodiment, the dynamic scan/clock buffers 54 are also coupled to receive the scan clock and scan mode signals. The dynamic scan/clock buffers 54 may generate several clock signals for use by the dynamic circuitry in each phase, to ensure that scanned in data is properly propagated through the dynamic circuitry to a storage device for sampling. At least some dynamic circuits may require an evaluate phase (and an inactive precharge phase) to propagate a value, for example. The clocks may function as precharge and/or evaluate clocks during functional operation, and may exhibit the desired behavior when scan is active. After the data is propagated to the storage device, the storage device may sample the result value. The result captured by the storage device may be scanned out of the storage device for comparison to the expected data. Examples of clocks to be generated for various configurations of dynamic circuitry 52 are shown in FIGS. 11–13 and 14–16. In other embodiments, one clock per dynamic phase may be generated.

Generally, the static circuitry 50 and the dynamic circuitry 52 may communicate. Functional signals may be fed back and forth (e.g. the static circuitry 50 may generate an output that is used by the dynamic circuitry 52 or vice versa). Additionally, scan signals may be fed back and forth (e.g. connections in the scan chain). While the static circuitry 50 and the dynamic circuitry 52 are illustrated as blocks in FIG. 6 for convenience of illustration, generally the static circuitry and dynamic circuitry may be intermixed throughout the integrated circuit 10 as needed to perform the functions defined for the integrated circuit 10.

It is noted that, while the static circuitry 50 receives the scan in signal and the dynamic circuitry 52 provides the scan out signal in the illustrated embodiment, other embodiments may have the dynamic circuitry 52 receive the scan in signal and/or have the static circuitry 50 receive the scan out signal. Additionally, the integrated circuit 10 may support multiple parallel scan chains, either by providing additional scan in and scan out signals or by multiplexing the scan chains onto the scan in and scan out signals.

As used herein, static circuits (or static logic) are circuits which continuously evaluate based on changes in received inputs, such that any change in an input is reflected on the output. Dynamic circuits are precharged to a first state and conditionally discharge to a second state based on certain input values. If the input values change after the discharge, the changes in the inputs are not propagated to the outputs. Generally, dynamic circuits receive at least one clock signal controlling the precharge and evaluation of the dynamic circuits. Dynamic circuits may be described as belonging to a dynamic phase. The precharge and evaluate of the dynamic circuits belonging to a dynamic phase occur approximately concurrently. Dynamic circuits belonging to different dynamic phases precharge and evaluate at different times. In the illustrated embodiment, there are two dynamic phases (A phase, with the precharge and evaluate phases determined by the ACLK(s), and B phase, with the precharge and evaluate phases determined by the BCLK(s)). The ACLK(s) may be approximately 180° out of phase with the BCLK(s) (i.e. the precharge phase of the A phase may occur approximately concurrent with the evaluate phase of the B phase, and vice versa).

As used herein, a static storage device may be a storage device having a static logic output. Also, dedicated scan circuits are circuits which are used only to provide scan functionality.

Figure 7:
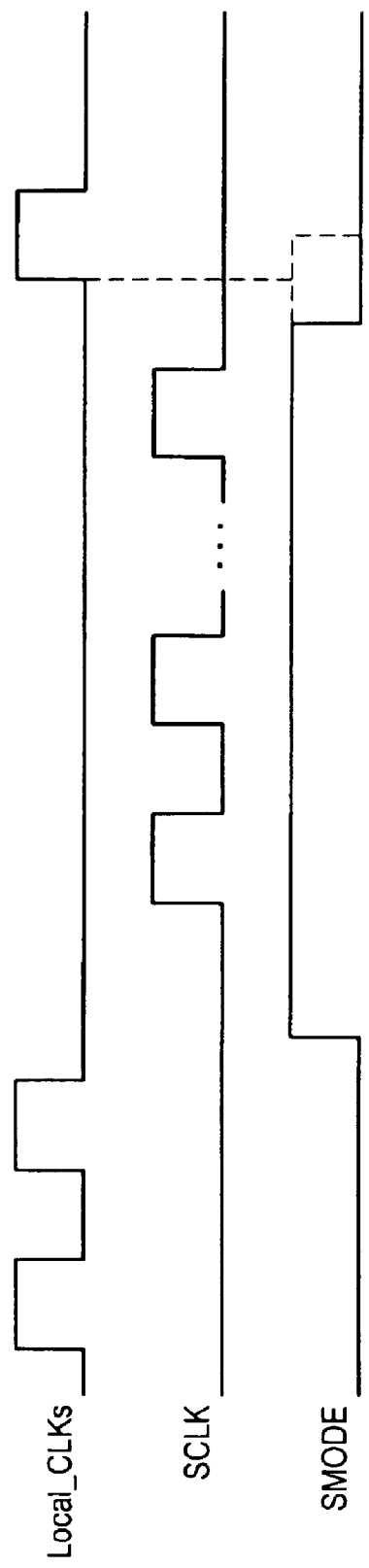
FIG. 7 is a timing diagram illustrating operation of one embodiment of scan control signals.

Turning now to FIG. 7, a timing diagram is shown illustrating operation of one embodiment of the scan interface for the integrated circuit 10. Other embodiments are possible and contemplated. FIG. 7 illustrates the local clocks (Local_CLKs, which may include the ACLK and BCLK, although one is approximately 180° out of phase with the Local_CLKs), the scan clock SCLK, and the scan mode signal SMODE.

The local clocks toggle for functional operation (e.g. two pulses are shown in FIG. 7) and then are stopped in preparation for scanning. The scan mode signal is asserted to indicate that scan is active. The scan clock is then toggled for a number of periods to scan in the test data. During scanning, the scan mode signal remains asserted. Subsequent to the last scan clock assertion, the scan mode signal is deasserted. In one embodiment, the scan mode signal may be deasserted prior to or subsequent to the first rising edge of the local clocks after scanning is complete, as illustrated by the dashed lines in FIG. 7. In one embodiment, the scan mode signal may be deasserted any time between the falling edge of the last scan clock and the falling edge of the first local clock. In other embodiments, the scan mode signal may deassert before the rising edge of the first local clock, or after the rising edge of the first local clock.

It is noted that the scan clock and the local clock may have different periods. For example, the scan clock may be toggled at a lower frequency than the local clock, so that the timing requirements on the circuitry involved in scanning, including any dedicated scan circuits that may be included, may be less stringent than functional timing requirements. The dedicated scan circuits may be sized significantly smaller than the functional circuits, thus lessening the impact of the dedicated scan circuits on the silicon area occupied by the integrated circuit 10.

Generally, a signal may be defined to be asserted in any logic state, and to be deasserted in the opposite logic state. For example, a signal may be defined to be asserted when in a high logic state and deasserted when in a low logic state (e.g. as shown in FIG. 7 for the scan mode signal). Alternatively, a signal may be defined to be asserted when in a low logic state and deasserted in a high logic state. In yet another alternative, a signal may be implemented differentially, with one difference indicating assertion and the opposite difference indicating deassertion. The example shown in FIG. 7 will be used for the remainder of this disclosure, but other examples may be used in other embodiments.

Figure 8:
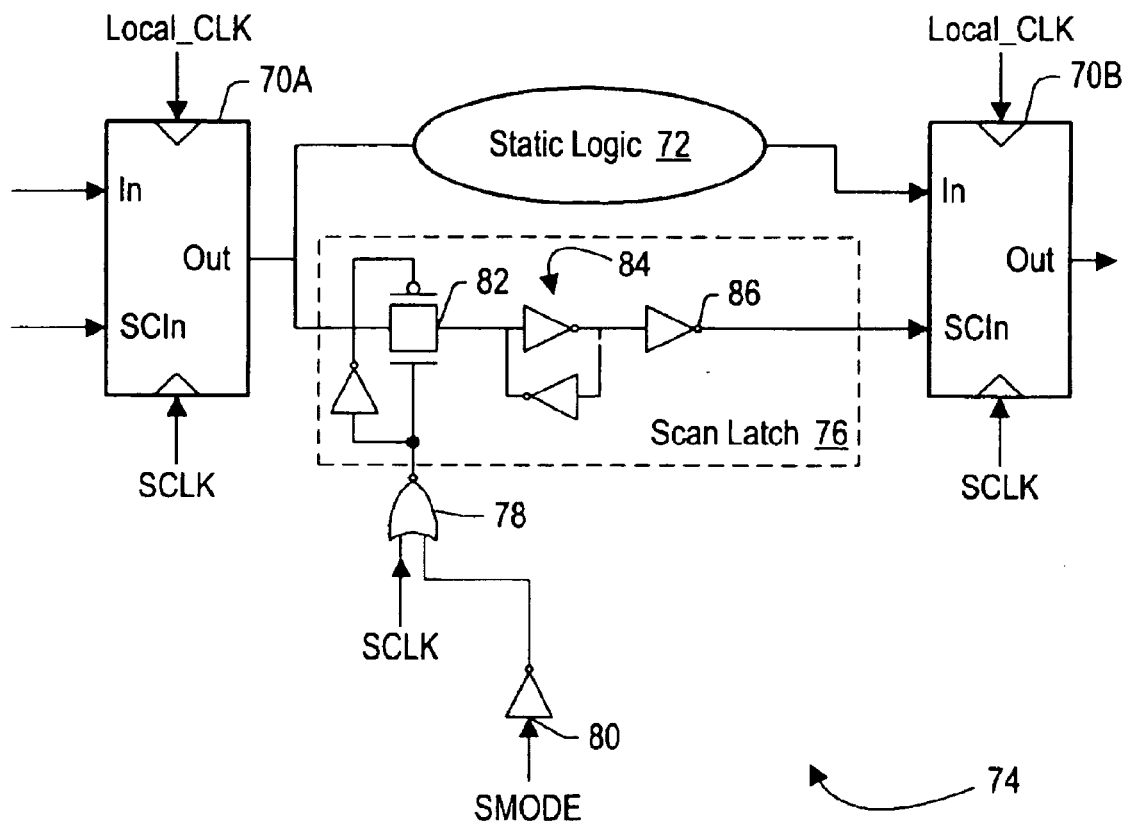
FIG. 8 is a circuit diagram of one embodiment of static logic scan circuitry.

Turning now to FIG. 8, a circuit diagram illustrating one embodiment of static scan circuitry is shown. Other embodiments are possible and contemplated. In the embodiment of FIG. 8, two static storage devices 70A and 70B included in a scan chain are shown. The storage devices 70A–70B are coupled to receive the local clock Local_CLK as a functional clock, and the scan clock SCLK as a scan clock. The storage devices 70A–70B include a functional input (In) and a scan input (SCIn). The scan input is used to connect the storage devices 70A–70B into a scan chain, and the functional input is used for functional operation. The storage devices 70A–70B also include an output (Out) which outputs the stored data (either scan data from the scan input or functional data from the functional input). The output of the storage device 70A is coupled to static logic 72, which generates a functional input to the storage device 70B. The output of the storage device 70A is also coupled to the dedicated scan circuit 74, which is further coupled to the scan input of the storage device 70B. In the illustrated embodiment, the dedicated scan circuit 74 includes a scan latch 76 and a logic circuit controlling the scan latch. In the illustrated embodiment, the logic circuit includes a NOR gate 78 coupled to receive the scan clock and an inversion of the scan mode signal through an inverter 80. In the illustrated embodiment, the scan latch 76 includes a passgate 82 controlled by the logic circuit, a latch 84 comprising cross coupled inverters, and an output inverter 86.

If the scan mode signal is deasserted, the output of the inverter 80 is a logical one, which causes the output of the NOR gate 78 to be a logical zero regardless of the state of the scan clock. Thus, the passgate 82 is closed in response to the scan mode signal being deasserted in the illustrated embodiment, isolating the rest of the scan latch 76 from the output of the storage device 70A. Thus, the scan latch circuitry 76 does not toggle in response to the output of the storage device 70A if the scan mode signal is deasserted, which may reduce the power consumed in the scan latch 76 when scan is inactive. Additionally, the load presented on the output of the storage device 70A by the scan latch 76 when scan is inactive may be the diffusion capacitance of the passgate 82, whereas the load when scan is active also includes current drawn by the latch 84 to toggle based on the state of the output of the storage device 70A.

On the other hand, if the scan mode signal is asserted (scan is active), the output of the inverter 80 is a logical zero and thus the output of the NOR gate 78 is the inverse of the scan clock. Thus, during the high phase of the scan clock, the passgate is closed and during the low phase of the scan clock, the passgate is open. The storage devices 70A–70B may capture a value from the scan input in response to the rising edge of the scan clock (and may propagate the value to the output of the storage device 70A–70B shortly thereafter). The scan latch 76 is closed during the high phase of the scan clock, and thus may serve to prevent a race condition between the output of the storage device 70A changing in response to its scan input and the scan input of the storage device 70B. In the illustrated embodiment, the storage devices 70A–70B update in response to the rising edge of the scan clock, and the new output value of the storage device 70A is propagated to the scan input of the storage device 70B during the low phase of the scan clock. The scan latch 76 holds the propagated value during the high phase of the scan clock, providing hold time for the scan input of the storage device 70B.

As mentioned above, the storage devices 70A–70B and the dedicated scan circuit 74 may form part of a scan chain. The scan input of the storage device 70A may be coupled to a preceding element in the scan chain (either another storage device or a dynamic circuit such as the circuit illustrated in FIG. 9) or the scan in input to the integrated circuit 10, if the storage device 70A is the first element in the scan chain. The output of the storage device 70B may be coupled to a subsequent element in the scan chain or the scan out output of the integrated circuit 10, if the storage device 70B is the last element in the scan chain. The storage devices 70A–70B may be viewed as forming a master storage element of a master-slave structure, and the scan latch 76 may be the slave storage element.

Figure 10:
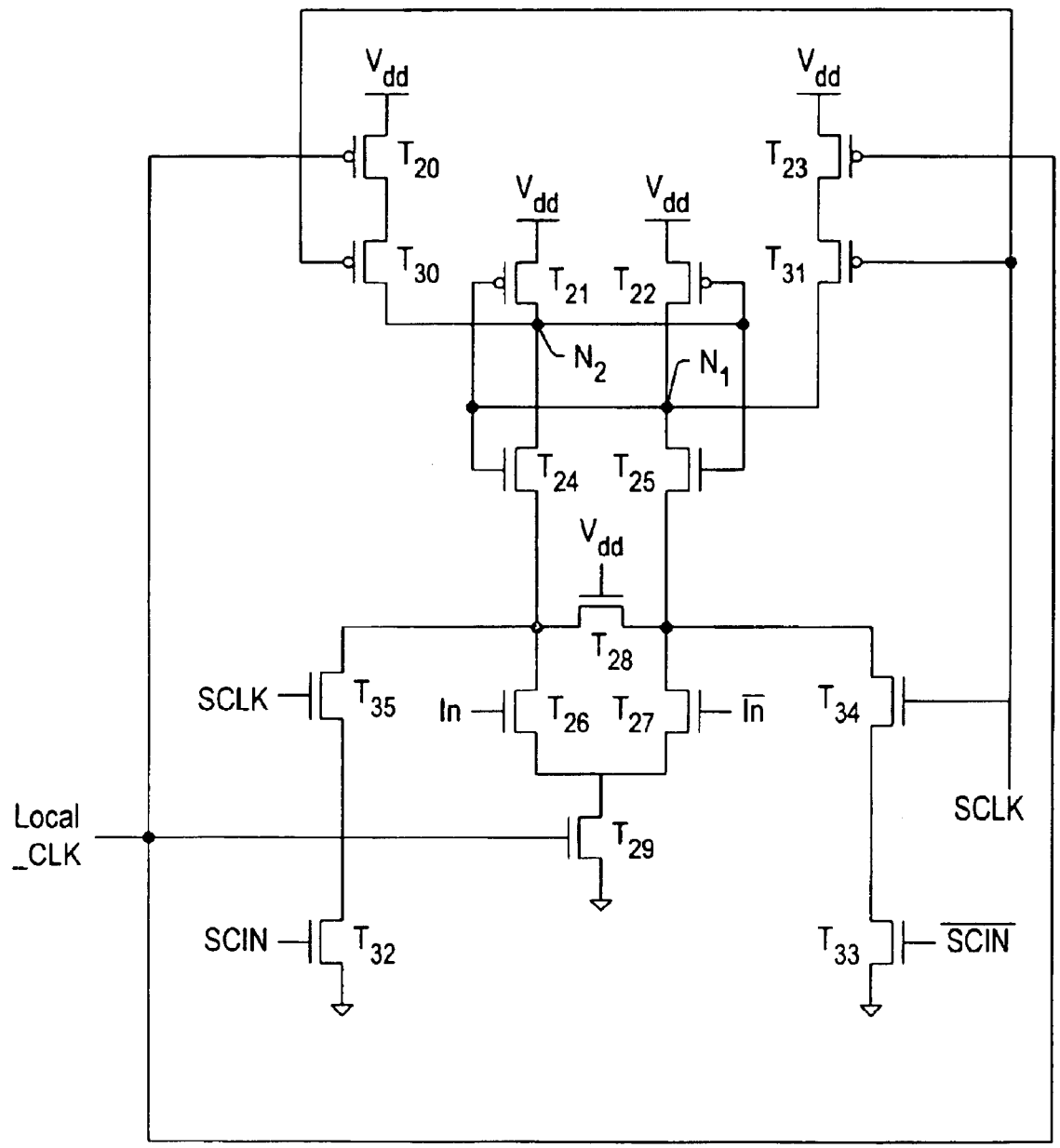
FIG. 10 is a circuit diagram of one embodiment of a flop with scan functionality.

The storage devices 70A–70B may be any type of storage device which supports scan. Generally, the storage devices 70A–70B may be configured to capture the data provided on the input (In) in response to the functional clock (Local_CLK) and to capture the data provided on the scan input (SCIn) in response to the scan clock (SCLK). The captured data is provided on the output. While the output of the storage devices 70A–70B supplies both the dedicated scan circuit 74 and the functional path (the static logic 72), other embodiments may include a separate scan out output for the scan chain. A portion of an exemplary storage device (in particular, a flop) is shown in FIG. 10.

It is noted that, while the logic circuit for controlling the scan latch 76 includes a NOR gate 78 and an inverter 80, other embodiments may include any logic circuit, dependent on the definition of assertion of the scan mode signal, the scan clock, and the control inputs provided on the scan latch 76. Furthermore, any Boolean equivalents of the logic circuit may be used. Additionally, the inverter 86 in the scan latch 76 is provided so that the output of the scan latch 76 has the same binary sense as the input to the scan latch. In other embodiments, the inverter 86 may be eliminated and the inversion provided by the scan latch may be accounted for in the scan data that is supplied to the scan in input of the integrated circuit 10.

In one embodiment, the static storage devices may be flops, although other devices may be used in other embodiments (e.g. latches, registers, etc.). If the flops are edge triggered, an alternative dedicated scan circuit may include an inverter delay chain to eliminate the potential race condition between the output of the flop 70A changing and the flop 70B sampling the SCIn input in response to the scan clock SCLK.

It is noted that, in some cases, there may be a race condition between the SCLK rising edge (which may cause the SCIn input of the storage device 70A to appear on the output of the storage device 70A) and the passgate 82 closing in response to the SCLK rising edge. If such a race condition exists, the SCLK signal supplied to the storage device 70A may be delayed (e.g. using an inverter delay chain) with respect to the SCLK signal supplied to the NOR gate 78. Alternatively, there may be no race condition due to layout of the circuitry, etc.

In another alternative that may be used with some embodiments of the storage device 70A, the logic circuitry 78 and 80 may be used to supply the scan clock SCLK to the storage device 70A and the scan clock SCLK may be used to control the passgate 82.

Figure 9:
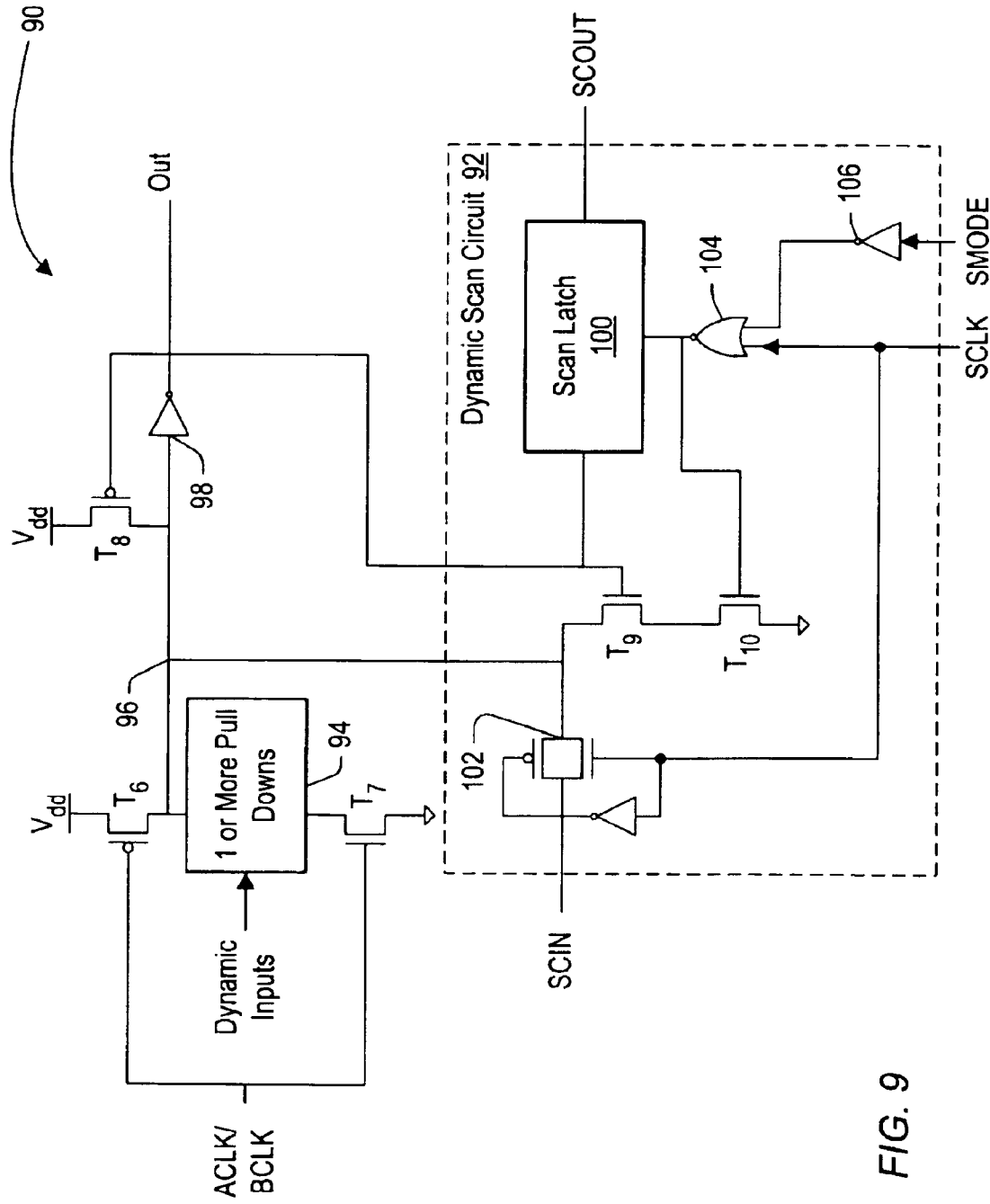
FIG. 9 is a circuit diagram of one embodiment of dynamic logic scan circuitry.

Turning now to FIG. 9, a circuit diagram of one embodiment of a dynamic logic circuit 90 including a dedicated scan circuit (the dynamic scan circuit 92) for supporting scanning is shown. Other embodiments are possible and contemplated. The dynamic logic circuit 90 may be included in a scan chain with other dynamic logic circuits or static circuits (e.g. circuitry such as shown in FIG. 8). The dynamic logic circuit 90 includes a precharge transistor T6 and an evaluate transistor T7 having gate nodes coupled to receive the ACLK or BCLK that controls the dynamic phase to which the dynamic logic circuit belongs, as well as one or more pull downs 94 coupled in series with the evaluate transistor T7. The pull downs 94 are coupled to receive the dynamic inputs to the dynamic circuit 90, and may have any structure to perform the logic desired in the dynamic logic circuit 90. The node 96 to which the precharge transistor T6 and the pull downs 94 are coupled is coupled to an inverter 98, the output of which is the functional output of the dynamic logic circuit 90. The transistor T8 has its gate node coupled to the functional output, and has a source node coupled to the power supply and a drain node connected to the node 96. The transistor T8, during functional operation, is configured to actively retain the precharge of the node 96 during the evaluate phase if the pull downs 94 (in combination with the evaluate transistor T7) do not discharge the node 96. The dynamic scan circuit 92 is coupled to the node 96 as well as the functional output. More particularly, the dynamic scan circuit 92 includes a series connection of transistor T9 and T10, a scan latch 100, a passgate 102, and a logic circuit including a NOR gate 104 and an inverter 106 in the illustrated embodiment. The scan latch 100 has an input coupled to the functional output and an output forming the scan output (SCOUT) of the dynamic scan circuit 92. The scan latch 100 is controlled by the output of the NOR gate 104, which is also connected to the gate node of the transistor T10. The gate node of the transistor T9 is connected to the functional output. In the illustrated embodiment, the drain node of the transistor T9 is connected to the node 96 and the source node of the transistor T9 is connected to drain node of the transistor T10, which has a source node coupled to ground. The passgate 102 is connected to the node 96 and to the scan input of the dynamic scan circuit 92. The passgate 102 is controlled by the scan clock.

If the transistor T10 is active, the transistors T8 and T9 and the inverter 98 operate as a set of cross coupled inverters. Thus, the value on the node 96 is actively maintained (if the transistor T10 is active) in either state (high or low). If the transistor T10 is inactive, the transistor T8 actively maintains a high state (logic 1) on the node 96 but the transistor T9 is prevented from actively maintaining a low state (logic 0) on the node 96 (e.g. similar to the operation of a typical dynamic logic circuit that does not include the dynamic scan circuit 92).

In the illustrated embodiment, the transistor T10 is controlled by the output of the NOR gate 104. If scan is inactive (the scan mode signal is deasserted), the output of the inverter 106 is a logical one and thus the output of the NOR gate 104 is a logical zero regardless of the state of the scan clock. Therefore, the transistor T10 is inactive if scan is inactive. If scan is active (the scan mode signal is asserted), the output of the NOR gate is the inverse of the scan clock. Accordingly, the transistor T10 is active during the low phase of the scan clock and inactive during the high phase. The combination of the transistors T8, T9, and T10 actively hold the value on the node 96 during the low phase of the scan clock. During the high phase of the scan clock, the transistors T10 and T9 do not actively drive the node 96. However, during the high phase of the scan clock, the passgate 102 is open and thus the scan input (SCIn) to the dynamic scan circuit 92 drives the node 96. By deactivating the transistor T10 during the high phase of the scan clock during scanning, the transistor T9 and T10 do not resist the driving of the node 96 by the scan input. In other embodiments, the transistor T10 may alternatively be driven directly by the scan mode signal (or the inverse thereof, if the scan mode signal is defined to be asserted low).

Providing the transistor T9 and T10 for operation during scan mode ensures that the value on the node 96 is actively driven in either state. If a binary zero is scanned onto the node 96 via the scan input, the value is actively held by the transistor T9 (active because the functional output is a binary one) and the transistor T10 (active during the low phase of the scan clock). This circuit arrangement may provide flexibility in the speed at which scan testing is performed. Since the scan value is actively held on the node 96, the scan data may not be lost due to leakage currents in inactive transistors connected to the node 96 even if the scan data is left on the node 96 for a relatively long period of time. Similarly, the arrangement may provide scalability to different manufacturing processes (where leakage currents in transistors may be greater, and thus leakage of the node 96 may be higher).

The scan clock is held low when scanning is not being performed, and the passgate 102 is closed when the scan clock is low. Thus, the node 96 is isolated from the scan input during functional operation. Alternatively, the passgate 102 may be controlled by a combination of the scan clock and scan mode signal such that the scan mode signal ensures that the passgate 102 is closed if scan is inactive and controlled by the scan clock as described above if scan is active.

The combination of the inverter 98 with the transistors T8, T9, and T10 may be viewed as a master storage element in a master/slave structure, and the scan latch 100 may be the slave. The scan latch 100 may generally be similar to the scan latch 76 shown in FIG. 8. Alternatively, any storage device may be used.

Since the passgate in the scan latch 100 is closed if scan is inactive (similar to the above discussion with respect to FIG. 8) and the transistor T10 is inactive if scan is inactive for the illustrated embodiment, the dynamic scan circuit 92 may generally not operate if scan is inactive. That is, the circuitry forming the dynamic scan circuit 92 may generally not toggle during functional operation, thus reducing the power consumption of the dynamic scan circuit 92 during functional operation. Additionally, the load presented by the dynamic scan circuit 92 may comprise the diffusion capacitance of the passgate in the scan latch 100 and the gate node capacitance of the transistor T9 on the functional output, and the diffusion capacitance of the passgate 102 and the transistor T9 on the node 96. The loading may be relatively light, and thus the impact on the functional speed of the dynamic logic circuit 90 may be relatively light.

Generally, the transistor sizes of the dedicated scan circuitry shown in FIGS. 8 and 9 may be any desired size. The transistor sizes in the dedicated scan circuitry may be made smaller than the transistor sizes typically used in the functional circuits in some embodiments, since scan is often performed at a lower frequency than functional operation. In one implementation, the transistors T9 and T10 may be sized similar to the transistor T8. Alternatively or additionally, the transistors in the dedicated scan circuitry may be designed to have a high threshold voltage (which may reduce leakage current in the transistors).

It is noted that the gate node connections to the transistors T9 and T10 may be reversed in other embodiments. That is, the gate node of the transistor T9 may be connected to the output of the NOR gate 104 and the gate node of the transistor T10 may be connected to the functional output of the dynamic logic circuit 90. It is further noted that, while the logic circuit controlling the transistor T10 and the scan latch 100 comprises a NOR gate 104 and an inverter 106 in the illustrated embodiments, other embodiments may employ any logic circuit, dependent on the definition of assertion of the scan mode signal, the scan clock, and the control inputs provided on the scan latch 100 and the transistor T10. Furthermore, any Boolean equivalents of the logic circuit may be used.

In the illustrated embodiment, the transistors T6 and T8 may be PMOS transistors and the transistors T7, T9, and T10 may be NMOS transistors, although other types of transistors may be used in other embodiments.

As used herein, the term "functional operation" refers to the operation of a circuit when scan is not active (that is, when the circuit is performing its designed function rather than operating in the scan test mode).

Turning next to FIG. 10, a block diagram of an exemplary portion of a flop circuit 110 which may be included in the storage devices 70A or 70B is shown. Other embodiments are possible and contemplated.

The transistors T21, T22, T24, and T25 form cross-coupled inverters than can be used as a memory cell. During the low phase of the local clock (Local_CLK) during functional operation (scan clock is low), the transistors T20 and T23 precharge the input and output nodes of the inverters to a high voltage. During the high phase of the clock, the transistor T29 activates. The input signal (In) and its complement (In with a bar over it) are coupled to the transistors T26 and T27. Operation for In being a one (and thus In with a bar over it being a zero) will be described first. Transistor 26 is active, and transistor T27 is inactive. Therefore, the node N1 begins discharging through T26 (active due to the In signal being a one), T28 (which is always active) and T25 (active due to the precharge). The node N2 (which is also the output node) begins discharging through T26 and T24 (active due to the precharge). Since node N2 is being discharged through two transistors while N1 is being discharged through three transistors, N2 is discharged more rapidly (which also causes T25 to deactivate and T22 to activate) and thus the node N1 finishes at a high voltage and the node N2 finishes at a low voltage. Similar operation occurs if In is a zero, except that T27 is active instead of T26 and N1 finishes at a low voltage, and the node N2 finishes at a high voltage.

The transistors T32 and T33 operate similar to the transistors T26 and T27, respectively, in response to the scan input and its inverse, during the high phase of the scan clock, thus storing the scan input in the cross coupled inverter structure formed by the transistors T21, T22, T24, and T25. During the low phase of the scan clock, the transistors T30 and T31 precharge the input and output nodes of the cross coupled inverter structure (since the local clock is held low during scan and therefore the transistors T20 and T23 are active). Additionally, during the high phase of the scan clock, the transistors T30 and T31 serve to isolate the cross coupled inverter structure from the transistors T20 and T23 (which remain active due to the local clock remaining low).

In the illustrated embodiment, the transistors T35 and T36 are coupled to the scan clock and prevent the transistors T32 and T33 from having an effect on the rest of the flop 110 if the scan clock is low. Thus, during functional operation, the load presented on the drains of the T26 and T27 transistors by the scan transistors T32, T33, T34, and T35 may be limited to the diffusion capacitance of the transistors T34 and T35. In other embodiments, the transistors T32 and T33 may be coupled to a transistor controlled by the scan clock similar to the transistors T26, T27, and T29.

The nodes N2 and N1 represent the value stored in the flop 110. One or both of the nodes N2 and N1 may be buffered to supply the output of a flop. For example, in one embodiment, the node N2 may be coupled to the input of a dynamic to static converter circuit, the output of which may be the output of the flop. Alternatively, a pair of cross-coupled 2-input NAND gates may have their other inputs coupled to the N2 and N1 nodes, respectively, and the output of one of the NAND gates may form the functional output of the flop.

Scanning of Dynamic Logic Circuits

Turning now to FIGS. 11–16, two examples of scanning scan data into a given node of a set of dynamic logic circuits are shown. The clocks provided to various dynamic logic circuits are shown, for ensuring that the scan data propagates through subsequent dynamic logic circuits and for ensuring that a result of the scan data reaches a sampling device prior to the scan out of the result data. Additionally, the clocks may ensure that the scan data is protected from change until it propagates. The clocking illustrated in these examples may be used in certain embodiments, although other embodiments may employ dynamic logic scanning without the clocking illustrated in the following examples (e.g. the dynamic logic circuits which are scanned may include local circuitry to control the clocks during scanning, or may feed only static logic, etc.).

Figure 11:
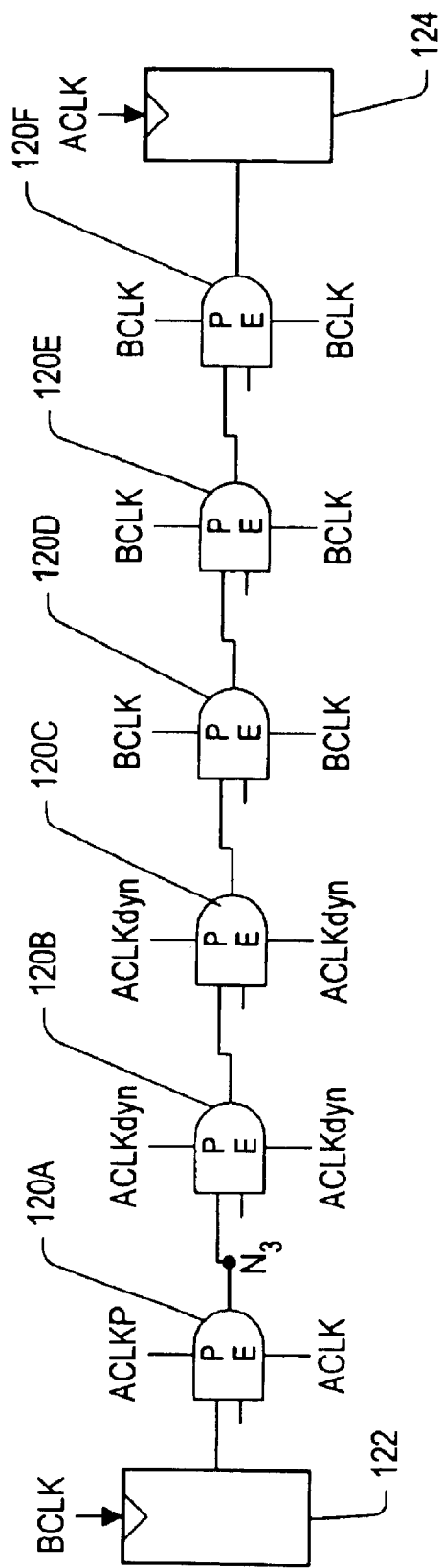
FIG. 11 is a circuit diagram of one embodiment of dynamic logic circuitry with scan support
Figure 12:
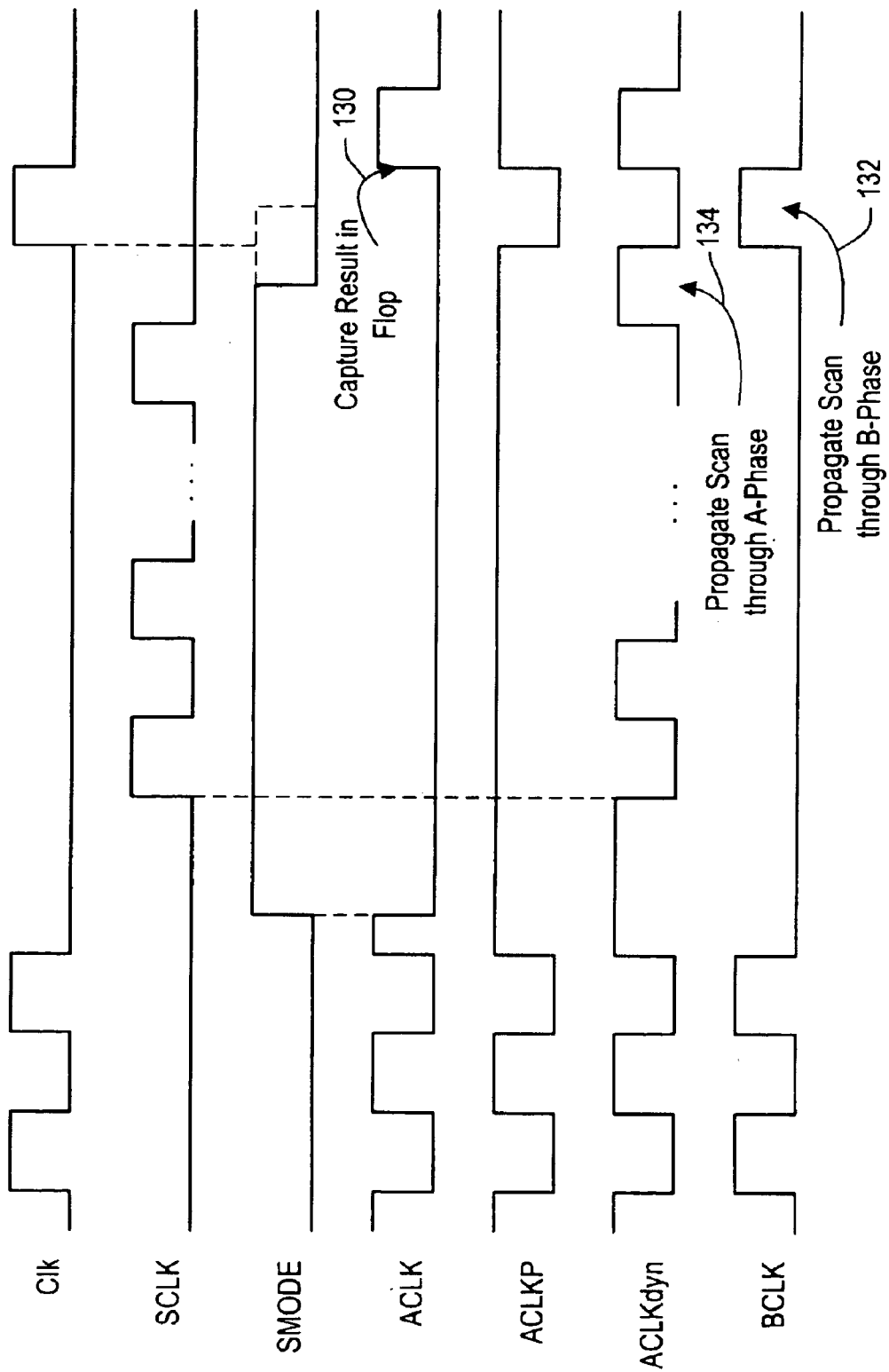
FIG. 12 is a timing diagram illustrating operation of one embodiment of clock signals and scan control signals for the embodiment of FIG. 11.
Figure 13:
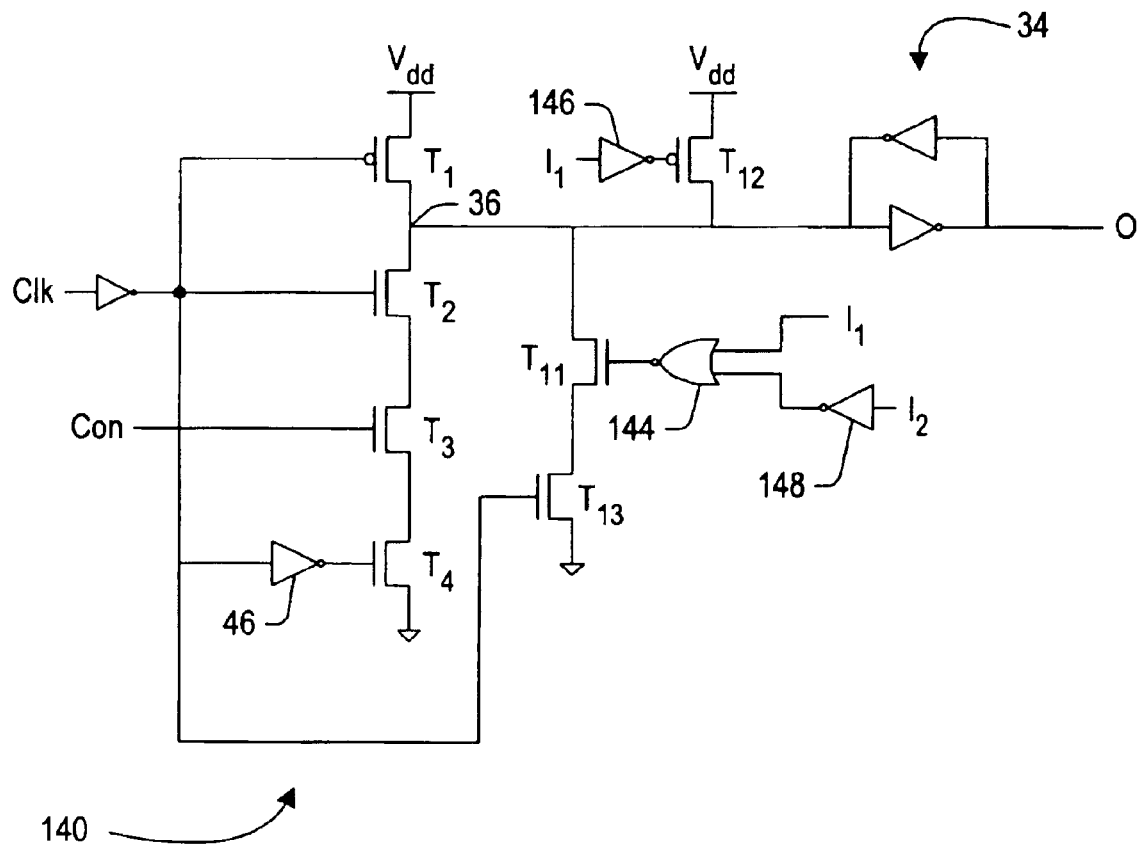
FIG. 13 is a circuit diagram of one embodiment of a clock buffer circuit for the embodiment of FIGS. 11 and 12.
Figure 14:
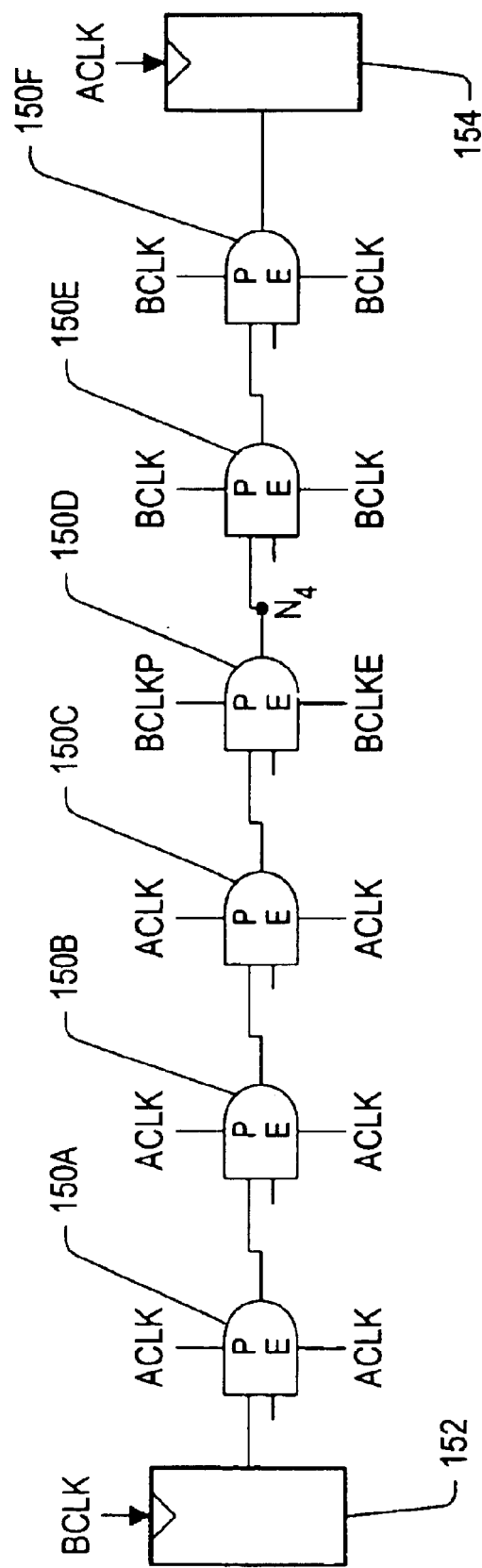
FIG. 14 is a circuit diagram of one embodiment of dynamic logic circuitry with scan support.
Figure 15:
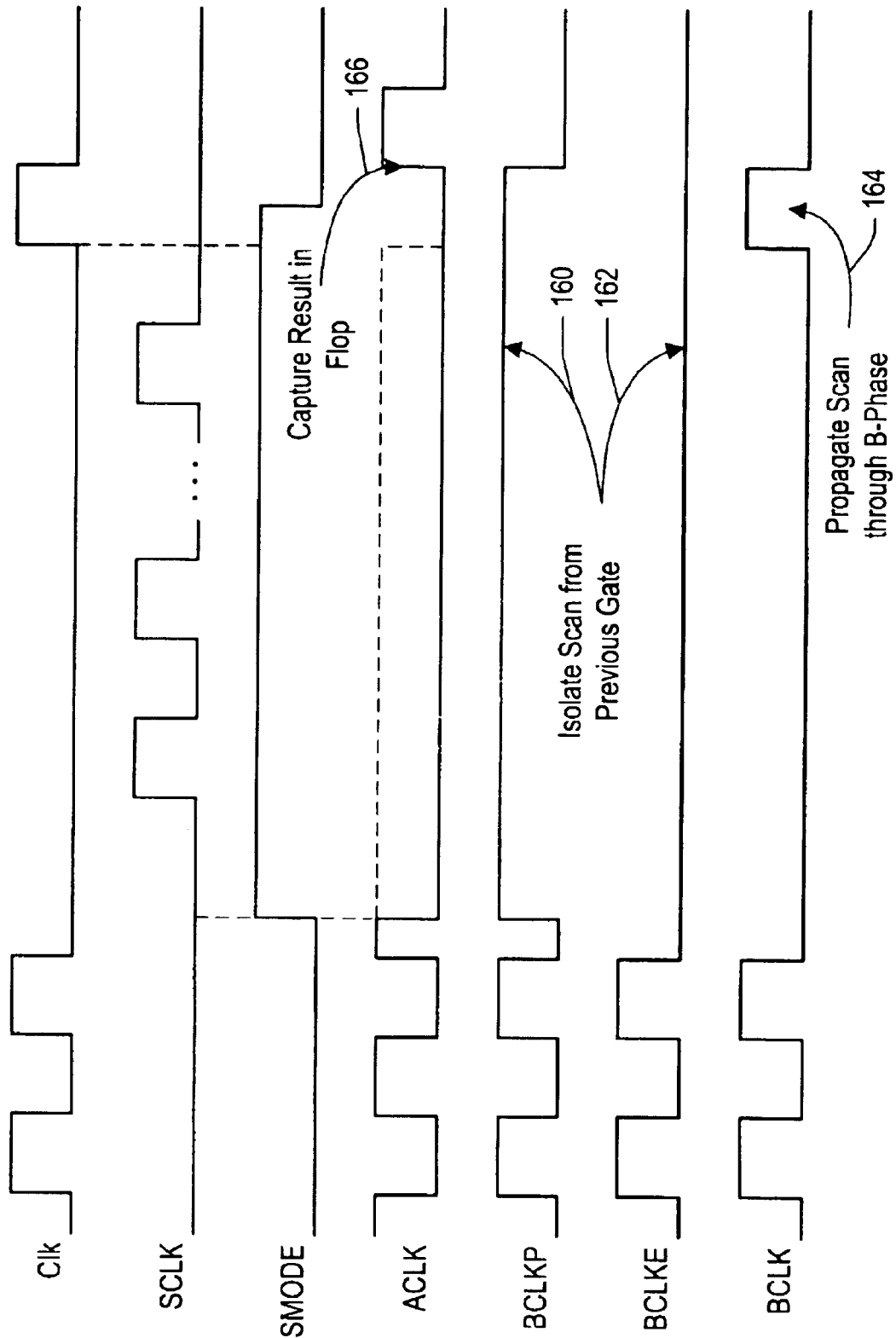
FIG. 15 is a timing diagram illustrating operation of one embodiment of clock signals and scan control signals for the embodiment of FIG. 14.
Figure 16:
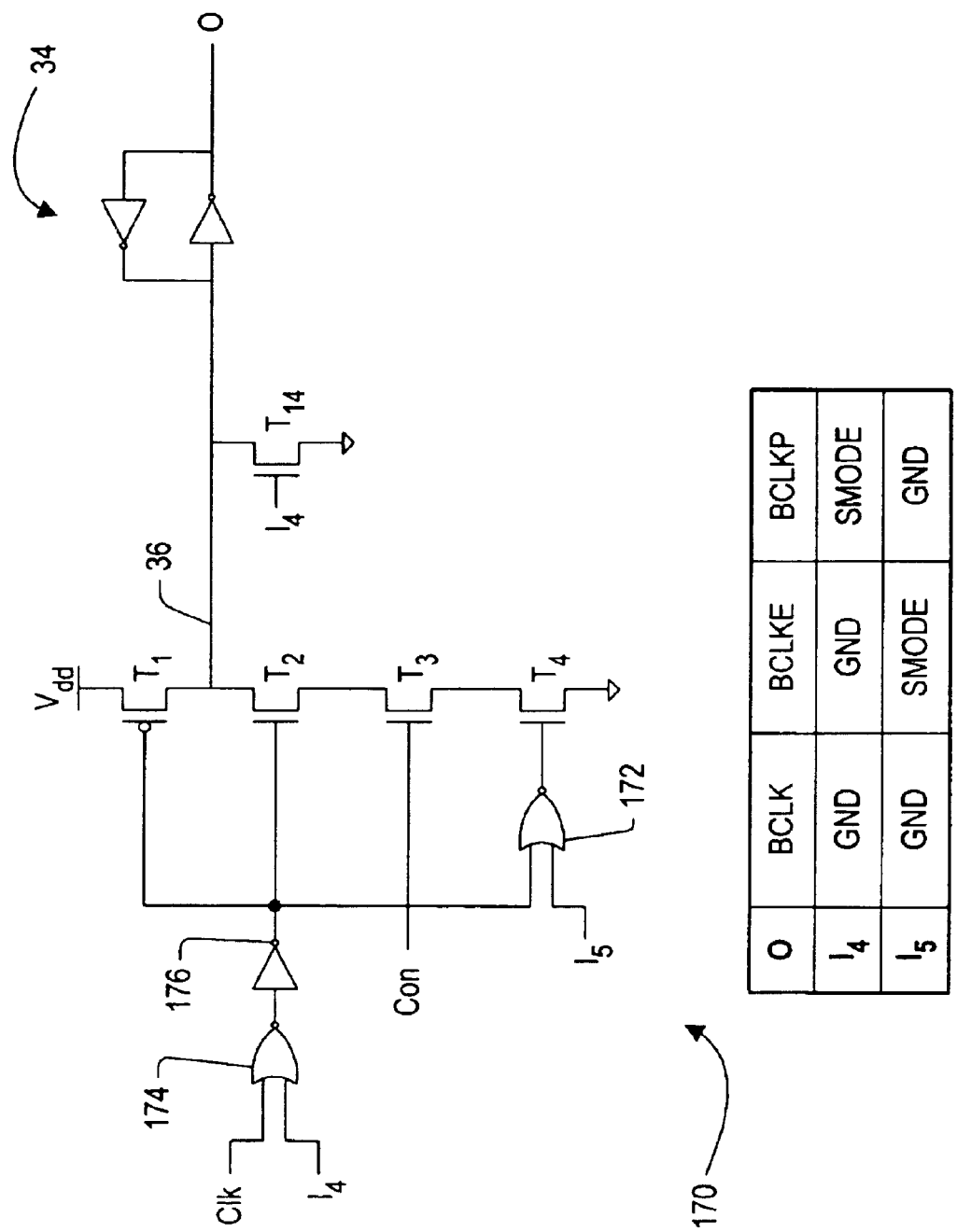
FIG. 16 is a circuit diagram of one embodiment of a clock buffer circuit for the embodiment of FIGS. 14 and 15.

The example illustrated in FIGS. 11–13 is an example in which scan data is scanned into an output node of a dynamic logic circuit which belongs to a first dynamic phase, and the sampling point is through one or more dynamic logic circuits in the first dynamic phase and one or more dynamic logic circuits in a second dynamic phase. For example, the first dynamic phase may be the A-phase, corresponding to an ACLK which is approximately 180° out of phase with the clock input to the conditional clock buffers in functional operation, and the second dynamic phase may be the B-phase, corresponding to a BCLK which is approximately in phase with the clock input to the conditional clock buffers in functional operation. However, the opposite phases may be used in other examples. The example illustrated in FIGS. 14–16 is an example in which scan data is scanned into an output node of a dynamic logic circuit which belongs to a first dynamic logic phase, and the sampling point is through one or more dynamic logic circuits in the first dynamic phase. For example, the first dynamic phase may be the B-phase in the example of FIGS. 14–16, but may be the A-phase in other examples.

Turning now to FIG. 11, a circuit diagram illustrating one embodiment of a set of dynamic circuits 120A–120F coupled to provide a logic function is shown. Particularly, the output of the dynamic logic circuit 120A is coupled as an input to the dynamic logic circuit 120B; the output of the dynamic logic circuit 120B is coupled as an input to the dynamic logic circuit 120C; etc. Each dynamic logic circuit 120A–120F includes one or more dynamic inputs (on the left side of the corresponding dynamic logic circuit as illustrated in FIG. 11), at least one dynamic output (on the right side of the corresponding dynamic logic circuit as illustrated in FIG. 11), a precharge input (labeled P in FIG. 11), and an evaluate input (labeled E in FIG. 11). The dynamic logic circuits 120A–120C are in the A-phase and the dynamic logic circuits 120D–120F are in the B-phase for this example. The dynamic logic circuit 120A is coupled to receive an input from a flop 122 clocked by BCLK (i.e. the dynamic logic circuit 120A is the first stage in the logic function). The dynamic logic circuit 120F is coupled to provide an output to a flop 124 clocked by ACLK.

Generally, each dynamic logic circuit 120A–120F is configured to precharge in response to its precharge input and is configured to conditionally evaluate in response to its evaluate input. Particularly, a pulse low on the precharge input (a "precharge pulse") causes a dynamic logic circuit 120A–120F to precharge and a pulse high on the evaluate input ("an evaluate pulse") causes a dynamic logic circuit 120A–120F to conditionally discharge based on the dynamic inputs to that dynamic logic circuit (although other embodiments may use different pulses to cause precharge and evaluation). For example, in dynamic logic circuits similar to the dynamic logic circuit 90 shown in FIG. 9, the precharge input may be the gate node of the transistor T6 and the evaluate input may be the gate node of the transistor T7. In functional operation, the dynamic logic circuits in a given phase precharge and evaluate substantially concurrently. For scan testing, however, some of the dynamic logic circuits in a given phase may precharge and evaluate while others do not. Thus, there may be several clocks corresponding to a given phase which operate the same way in functional operation but which operate different than each other when scan is active.

In the example of FIG. 11, the output node (N3) of the dynamic logic circuit 120A receives scan data. That is, the dynamic logic circuit 120A may be similar to the dynamic logic circuit 90 shown in FIG. 9 (including the dedicated scan circuitry). The other dynamic logic circuits 120B–120F do not receive scan data (or provide scan data) in this example and thus may be dynamic logic circuits without the dedicated scan circuitry (although the dedicated scan circuitry may be included in these dynamic logic circuits as well, if desired).

After the scan data has been provided on the node N3 (e.g. through the internal node 96 in FIG. 9), the result corresponding to the scan data at the sampling point (the flop 124 in this example, although any storage device could be used in other embodiments) is computed. That is, the effect of the scan data is propagated through the dynamic logic circuits 120B–120F to the sampling point. Particularly, for the illustrated embodiment, each dynamic logic gate 120B–120C in the same dynamic phase (the A-phase) receives at least one evaluate pulse subsequent to the scan data being provided on the node N3. The evaluate pulse computes the result up to the end of the dynamic phase (e.g. the dynamic logic gate 120C in this example). In other words, the effect of the scan data is propagated to the output of the dynamic logic gate 120C. Subsequent to the evaluate pulse in the A-phase, at least one B-phase evaluate pulse is provided to the B-phase dynamic logic circuits 120D–120F to propagate the effect of the scan data to the output of the dynamic logic circuit 120F. That is, the result corresponding to the scan data is propagated to the output of the dynamic logic circuit 120F (the input of the sampling flop 124). The sampling flop may then be clocked to sample the output, and the output may be scanned out of the flop 124.

Additionally, in the illustrated embodiment, the precharge and evaluate of the dynamic logic circuit 120A may be controlled to isolate the output (node N3) from any changes due to the functional operation of the dynamic logic circuit 120A while scan is active. That is, the precharge and evaluation of the dynamic logic circuit 120A may be prevented until the scan data has been propagated to the sampling point and sampled.

In the illustrated embodiment, the dynamic logic circuit 120A receives an ACLKP clock on the precharge input and the ACLK clock on the evaluate input (where the ACLK clock is the clock which controls the flop 124 as well). The remaining A-phase dynamic logic circuits 120B–120C receive an ACLKdyn clock on both their precharge and evaluate inputs. Each of the ACLKP, ACLK, and ACLKdyn clocks are generated by dynamic scan/clock buffers 54 in FIG. 6. The dynamic scan/clock buffers 54 generate the ACLKP, ACLK, and ACLKdyn clocks based on the functional clock when scan is not active, and based on the scan clock and/or scan mode signal when scan is active. Additionally, a BCLK clock is provided on the precharge and evaluate inputs of each of the B-phase dynamic logic circuits 120D–120F. The BCLK clock may be generated by conditional or unconditional clock buffer circuits based on the functional clock, as illustrated in FIG. 12, or may also be generated using a dynamic scan/clock buffer circuit 54.

It is noted that, while the dynamic logic circuits 120A–120F resemble AND gates in FIG. 11, the symbol is intended to represent an arbitrary logic function in FIG. 11. Each dynamic logic circuit 120A–120F may implement any logic function, as desired, and different logic functions may be implemented in the various dynamic logic circuits 120A–120F. It is further noted that the maximum number of dynamic logic circuits in series which belong to the same dynamic phase may vary from embodiment to embodiment.

It is noted that, while scan data is scanned onto the output of the first A-phase stage in the logic function in FIG. 11, any stage in the A-phase of the logic function may be configured to receive the scan data (and receive the ACLKP and ACLK clocks) in other examples.

FIG. 12 is a timing diagram illustrating one example of the clocks shown in FIG. 11 and their control during functional operation and scan. Other embodiments are possible and contemplated. The functional clock input to the clock buffers in the clock tree is shown (Clk), as well as the scan clock and the scan mode signal. The ACLK, ACLKP, ACLKdyn, and BCLK clocks are shown.

Two periods of the functional clock Clk are shown prior to stopping the functional clock for scanning. As FIG. 12 illustrates, each of the ACLK, ACLKP, and ACLKdyn clocks are approximately 180° out of phase with the functional clock (and are approximately in phase with each other). Additionally, the BCLK clock is approximately in phase with the functional clock.

The functional clock is stopped (low in this example), and thus oscillations of the ACLK, ACLKP, ACLKdyn, and BCLK clocks in response to the functional clock also stop. In particular, the ACLK, ACLKP, and ACLKdyn clocks may stop in a high state (if the condition signal is asserted for the last falling edge of the functional clock) or a low state (if the condition signal is deasserted for the last falling edge of the functional clock) and the BCLK clock may stop in the low state.

To prevent the precharging of the dynamic logic circuit 120A when the scan data is scanned into the node N3, the ACLKP clock is held high during scan. To prevent evaluation of the dynamic logic circuit 120A during scan, the ACLK clock is held low. In this example, the assertion of the scan mode signal is used to drive the ACLK clock low. Thus, before data is scanned into the node N3, the evaluation of the dynamic logic circuit 120A is stopped. For the ACLKdyn clock, at least one evaluate pulse is generated before the pulse on the ACLK clock that causes the result to be captured in the flop 124. There may be additional evaluate and/or precharge pulses while scanning is active, and in the example shown, the ACLKdyn clock toggles approximately 180° out of phase with the scan clock. In other embodiments, only one evaluate pulse may be generated on the ACLKdyn clock.

After scanning completes, the functional clock is pulsed at least once (although multiple pulses may be used if desired). The first pulse on the ACLK clock after scanning completes is indicated by the arrow 130. This pulse causes the result on the output of the dynamic logic circuit 120F to be captured in the flop 124. Prior to this pulse, at least one pulse occurs on the BCLK clock to propagate the effect of the scan data through the B-phase dynamic logic circuits, and prior to the pulse on the BCLK is at least one pulse on the ACLKdyn clock to propagate the effect of the scan data through the A-phase dynamic logic circuits. The pulse on the BCLK clock is indicated by the arrow 132, and the pulse on the ACLKdyn clock is indicated by the arrow 134.

Turning next to FIG. 13, a circuit diagram of one embodiment of a clock buffer circuit 140 is shown. Other embodiments are possible and contemplated. The embodiment of FIG. 13 is based on the conditional clock buffer circuit 20A shown in FIG. 5, and the transistors T1, T2, T3, and T4 (and optionally T5, not shown in FIG. 13) operate similar to the discussion of FIG. 5 in functional operation, in response to the functional clock Clk and the condition signal Con. The functional clock is inverted in this embodiment to provide the 180° out of phase output O. Additionally, the latch circuit 34 and the inverter 46 may operate similar to the above circuit in functional mode. Furthermore, the latch circuit 34 may provide stability of the output O and the internal node 36 during scan by latching the value provided on the node 36 by the other transistors in the circuit. The clock buffer circuit 140 includes additional transistors T11 and T12 (and optionally T13), a NOR gate 144, and inverters 146 and 148. The transistor T11 includes a gate node connected to the output of the NOR gate 144, a drain node connected to the node 36, and a source node connected to the drain node of the transistor T13. The transistor T13 also has a source node coupled to ground and a gate node coupled to receive the inverted clock Clk. The NOR gate 144 has inputs coupled to receive an input I1 and to the output of the inverter 148, which has an input coupled to receive an input I2. The transistor T12 includes a source node coupled to the power supply, a drain node connected to the node 36, and a gate node coupled to the output of the inverter 146, which has an input coupled to receive the input I1.

The clock buffer circuit 140 may be used to form the dynamic scan/clock buffers 54 for the example shown in FIG. 11. That is, copies of the clock buffer circuit 140 may be instantiated with the their inputs programmed as shown in the table in FIG. 13 to generate the ACLKP, ACLK, and ACLKdyn clocks. Multiple copies of the clock buffer circuit 140 may be programmed the same way to generate multiple signals corresponding to a given clock (e.g. for loading purposes). The BCLK clock may be generated using a conditional clock buffer circuit 20A similar to the embodiment in FIG. 5 (or an unconditional clock buffer circuit) based on the functional clock, since the BCLK clock follows the functional clock in this example.

When the functional clock Clk is stopped in a low state, the transistor T2 is active and the transistors T1 and (after a delay) T4 are inactive. The transistor T3 is active or inactive based on the state of the condition signal. Assuming the condition signal was asserted for the last falling edge of the functional clock Clk, the node 36 is discharged and thus the output O is high when the functional clock is stopped. Alternatively, if the condition signal was not asserted for the last falling edge of the functional clock Clk, the node 36 is not discharged and the output O is low when the functional clock is stopped.

The table in FIG. 13 illustrates the clock output O desired (either ACLK, ACLKP, or ACLKdyn) and the corresponding connections of the I1 and I2 inputs for the copy or copies of the clock buffer circuit 140 used to generate that clock. Thus, for the ACLK clock, the input I1 is coupled to the scan mode signal (SMODE) and the input I2 is coupled to ground. The input I2 being coupled to ground causes the output of the NOR gate 144 to be a logical zero, and thus the transistor T11 is inactive. The input I1 being coupled to the scan mode signal causes the transistor T12 to activate in response to an assertion of the scan mode signal. Thus, the transistor T12 charges the node 36 (and thus the ACLK clock is forced low) in response to the asserted scan mode signal.

For the ACLKP clock, the input I1 is grounded and the input I2 is coupled to the scan mode signal. The grounding of the input I1 causes the T12 transistor to be inactive. The connection of the I2 signal to the scan mode signal causes the transistor T11 to be active if scan is active. Assuming the clock Clk is low (and thus the gate node of the transistor T13 is high), the transistors T11 and T13 discharge the node 36, and thus the ACLKP clock is high during scan. It is noted that the transistor T11 may be optional if the condition signal is asserted at the last falling edge of the functional clock, since the node 36 is discharged in this case. It is further noted that, if the scan mode signal is deasserted prior to the first assertion of the clock Clk, the transistor T13 may be optional. The transistor T13 prevents contention between the transistor T11 and the transistor T1 if the scan mode signal is still asserted during the first assertion of the clock Clk (which activates the transistor T1).

For the ACLKdyn clock, the input I1 is coupled to the scan clock and the input I2 is coupled to the scan mode signal. With the input I2 signal to the scan mode signal and the input I1 coupled to the scan clock, the output of the NOR gate 144 is in the inverse of the scan clock when scan is active. Therefore, during the low phase of the scan clock, the transistor T11 is active and discharges the node 36 (the transistor T13 is active due to the inverse of the clock Clk being high during scan). Additionally, coupling the I1 input to the scan clock signal causes the transistor T12 to be active during the high phase of the scan clock, charging the node 36 and causing the ACLKdyn clock to be low. Therefore, the ACLKdyn clock may be approximately 180° out of phase with the scan clock during scanning. The transistor T13 may be used to prevent contention between the transistor T11 and the transistor T1 if the scan mode signal remains asserted for the first assertion of the clock Clk, as mentioned above, and may be deleted if the scan mode signal is deasserted prior to the first assertion of the clock Clk.

It is noted that the T11, T12, and T13 transistors may be sized smaller than the transistors T1–T4, in some embodiments. It is further noted that, while copies of the clock buffer circuit 140 may be included in the dynamic scan/clock buffer circuits 54 with different connections on the I1 and I2 inputs to generate the ACLK, ACLKdyn, and ACLKP clocks, in other embodiments the unused transistors (and corresponding input logic circuits, in the case of the transistors T11 and T12) may be removed (e.g. the transistors T11 and T13 may be removed for the ACLK buffer; and the transistor T12 may be removed for the ACLKP buffer). Using the same circuit with different connections on the inputs may simplify the verification of the circuit for use in the integrated circuit 10, since clock circuits are often given extra verification effort to ensure their proper operation.

It is noted that, while each dynamic logic circuit shown in FIG. 11 includes an evaluate input, in some embodiments some of the dynamic logic circuits may not include an evaluate input (i.e. they may evaluate in response to inputs being asserted). It is still further noted that, while the clock buffer circuit 140 is conditional in this embodiment, in other embodiments the clock buffer may not be conditional, if desired.

It is noted that, while specific logic circuits 144, 146, and 148 are shown in FIG. 13, other embodiments may use other logic circuits, which may be dependent on the definition of asserted for the input signals. Additionally, any Boolean equivalents of the illustrated logic may be used.

In the illustrated embodiment, the transistors T11 and T13 may be NMOS transistors and the transistor T12 may be a PMOS transistor, although other transistor types may be used in other embodiments.

It is noted that, in other embodiments, the drain node of the transistor T11 may be coupled to the node between the transistors T2 and T3 (since the transistor T2 is active during scan), or to the node between the transistors T3 and T4 (if the condition signal is forced asserted during scan).

Turning now to FIG. 14, a circuit diagram illustrating a second embodiment of a set of dynamic circuits 150A–150F coupled to provide a logic function is shown. Particularly, the output of the dynamic logic circuit 150A is coupled as an input to the dynamic logic circuit 150B; the output of the dynamic logic circuit 150B is coupled as an input to the dynamic logic circuit 150C; etc. The dynamic logic circuits 150A–150F may be generally similar to the dynamic logic circuits 120A–120F, except that the node N4 (the output of the dynamic logic circuit 150D) is the node into which scan data is provided. Thus, the dynamic logic circuit 150D may be similar to the dynamic logic circuit 90 shown in FIG. 9 and the other dynamic logic circuits 150A–150C and 150E–150F may or may not include dedicated scan circuitry, as desired. The dynamic logic circuit 150A is coupled to receive an input from a flop 152 clocked by BCLK, and the dynamic logic circuit 150F is coupled to provide an output to a flop 154 (or other storage device) clocked by ACLK.

After the scan data has been provided on the node N4, the result corresponding to the scan data at the sampling point (the flop 154 in this example) is computed. That is, the effect of the scan data is propagated through the dynamic logic circuits 150E–150F to the sampling point. Particularly, for the illustrated embodiment, each dynamic logic gate 150E–150F receives at least one evaluate pulse subsequent to the scan data being provided on the node N4, thus propagating the effect of the scan data to the input of the flop 154. The sampling flop 154 may then be clocked to sample the output, and the output may be scanned out of the flop 154. Additionally, in the illustrated embodiment, the precharge and evaluate of the dynamic logic circuit 150D may be controlled to isolate the output (node N4) from any changes due to the functional operation of the dynamic logic circuit 150D while scan is active. That is, the precharge and evaluation of the dynamic logic circuit 150D may be prevented until the scan data has been propagated to the sampling point and sampled. Several B-phase clocks may be used to generate the above behavior, and each of the B-phase clocks may be generated the same during functional operation.

In the illustrated embodiment, the dynamic logic circuit 150D receives a BCLKP clock on the precharge input and a BCLKE clock on the evaluate input. The remaining B-phase dynamic logic circuits 150E–150F receive the BCLK clock. Each of the BCLKP, BCLKE, and BCLK clocks are generated by dynamic scan/clock buffers 54 in FIG. 6. The dynamic scan/clock buffers 54 generate the BCLKP, BCLKE, and BCLK clocks based on the functional clock when scan is not active, and based on the scan mode signal when scan is active.

It is noted that, while the dynamic logic circuits 150A–150F resemble AND gates in FIG. 14, the symbol is intended to represent an arbitrary logic function in FIG. 14.

Each dynamic logic circuit 150A–150F may implement any logic function, as desired, and different logic functions may be implemented in the various dynamic logic circuits 150A–150F. It is further noted that the maximum number of dynamic logic circuits in series which belong to the same dynamic phase may vary from embodiment to embodiment.

It is noted that, while scan data is scanned onto the output of the first B-phase stage in the logic function in FIG. 14, any stage in the B-phase of the logic function may be configured to receive the scan data (and receive the BCLKP and BCLKE clocks) in other examples.

FIG. 15 is a timing diagram illustrating one example of the clocks shown in FIG. 14 and their control during functional operation and scan. Other embodiments are possible and contemplated. The functional clock input to the clock buffers in the clock tree is shown (Clk), as well as the scan clock and the scan mode signal. In this case, the scan mode signal falls after the rising edge of the functional clock. The ACLK, BCLKP, BCLKE, and BCLK clocks are shown.

Two periods of the functional clock Clk are shown prior to stopping the functional clock for scanning. As FIG. 15 illustrates, each of the ACLK clock is approximately 180° out of phase with the functional clock. The BCLKP, BCLKE, and BCLK clocks are approximately in phase with the functional clock (and are approximately in phase with each other).

The functional clock is stopped (low in this example), and thus oscillations of the ACLK, BCLKP, BCLKE, and BCLK clocks in response to the functional clock also stop. In particular, the ACLK clock may stop in a high state and each of the BCLK, BCLKP, and BCLKE clocks may stop in the low state (both states corresponding to the low state of the functional clock Clk). Alternatively, the ACLK clock may stop in a low state if the ACLK clock is conditional and the condition signal is not asserted on the last falling edge of the functional clock Clk. In either case, pulsing the functional clock Clk after scanning results in the ACLK clock going low, and then high again (which causes the flop 154 to capture the output of the dynamic logic circuit 150F). The ACLK may be generated similar to the example of FIGS. 11–13, which may cause the ACLK to go low in response to the assertion of the scan mode signal. Alternatively, the ACLK signal may be allowed to remain high (or low, depending on the state of the condition signal at the last falling edge of the clock Clk) until the rising edge of the clock Clk (which forces the ACLK low). This operation is illustrated via the dotted line on the ACLK waveform in FIG. 15.

During scanning, the BCLKE clock is held low and the BCLKP clock is held high to prevent operation of the dynamic logic circuit 150D during scan. The BCLKE clock stops low, and thus is in the correct state when scanning begins. However, the BCLKP clock is also low. The scan mode signal is used to drive the BCLKP clock high. In this manner the scan data is isolated from the dynamic logic circuit 150D (arrows 160 and 162). The BCLK clock is also low during scanning in this example, although the BCLK clock may have any operation during scan as long as at least one evaluate pulse occurs after scanning is complete and before the pulse on the ACLK clock which causes the flop 154 to capture state. As with the example of FIGS. 11–13, the generation of the BCLK clock in response to the functional clock Clk provides the desired evaluate pulse (arrow 164), and then the ACLK pulse occurs (arrow 166).

Turning next to FIG. 16, a circuit diagram of one embodiment of a clock buffer circuit 170 is shown. Other embodiments are possible and contemplated. The embodiment of FIG. 16 is based on the conditional clock buffer circuit 20A shown in FIG. 5, and the transistors T1, T2, T3, and T4 (and optionally T5, not shown in FIG. 16) operate similar to the discussion of FIG. 5 in functional operation, in response to the functional clock Clk and the condition signal Con. Additionally, the latch circuit 34 may operate similar to the above circuit in functional mode. Furthermore, the latch circuit 34 may provide stability of the output O and the internal node 36 during scan by latching the value provided on the node 36 by the other transistors in the circuit. The clock buffer circuit 170 includes a NOR gate 172 in place of the inverter 46. The transistor which discharges the output of the NOR gate 172 in response to the rising edge of the functional clock may be sized similar to the above discussion for the inverter 46. The NOR gate 172 also includes an input coupled to an I5 signal. The clock buffer circuit 170 further includes a NOR gate 174 coupled to receive the functional clock Clk as an input and an I4 signal as in input. The NOR gate 174 is coupled to an inverter 176, the output of which is coupled to the gate nodes of the transistors T1 and T2 and as an input to the NOR gate 172 Additionally, the clock buffer circuit 140 includes a transistor T14 having a drain node connected to the node 36, a source node coupled to ground, and a gate node coupled to the I4 signal.

The clock buffer circuit 170 may be used to form the dynamic scan/clock buffers 54 for the example shown in FIG. 14. That is, copies of the clock buffer circuit 170 may be instantiated with the their inputs programmed as shown in the table in FIG. 16 to generate the BCLK, BCLKP, and BCLKE clocks. Multiple copies of the clock buffer circuit 170 may be programmed the same way to generate multiple signals corresponding to a given clock (e.g. for loading purposes).

The table in FIG. 16 illustrates the clock output O desired (either BCLK, BCLKP, or BCLKE) and the corresponding connections of the I4 and I5 signals for the copy or copies of the clock buffer circuit 170 used to generate that clock. Thus, for the BCLK clock, both the I4 and I5 signals are grounded. In this case, the transistor T14 is inactive and the clock buffer circuit 170 operates in the same fashion as the clock buffer circuit 20A shown in FIG. 5 (that is, the BCLK clock follows the functional clock Clk).

For the BCLKE clock, the I4 signal is grounded, thus deactivating the transistor T14 and passing the functional clock Clk to the output of the inverter 176. The I5 signal is coupled to the scan mode signal SMODE. Thus, if scan is active, the output of the NOR gate 172 is a logical zero and the transistor T4 is inactive. When the functional clock Clk starts after scanning is complete (with the scan mode signal still asserted as shown in FIG. 15), the gate node of the transistor T4 is already zero and thus there is no window in which both T2 and T4 are active. The node 36 is not discharged for the first clock pulse of the functional clock, and therefore the BCLKE clock remains low.

For the BCLKP clock, the I5 signal is grounded and the I4 signal is coupled to the scan mode signal. Thus, if scan is active, the T14 transistor is active and discharges the node 36. The BCLKP clock is therefore high if scan is active. Additionally, the I4 signal being active at the input of the NOR gate 174 prevents the precharge transistor T1 from activating while scan is active (since the functional clock Clk is low, and would otherwise activate the transistor T1). The BCLKP clock therefore remains high until after the first pulse of the functional clock Clk.

It is noted that, while copies of the clock buffer circuit 170 may be included in the dynamic scan/clock buffer circuits 54 with different connections on the I4 and I5 inputs to generate the BCLK, BCLKP, and BCLKE clocks, in other embodiments the unused transistors and/or logic circuits may be removed (e.g. the transistor T14, the NOR gate 174, the inverter 176 may be removed and the NOR gate 172 may be replaced by the inverter 46 for the BCLK buffer; the transistor T14, the NOR gate 174, and the inverter 176 may be removed for the BCLKE buffer; and NOR gate 172 may be replaced by the inverter 46 for the BCLKP buffer). Using the same circuit with different connections on the inputs may simplify the verification of the circuit for use in the integrated circuit 10, since clock circuits are often given extra verification effort to ensure their proper operation.

It is noted that, while each dynamic logic circuit shown in FIG. 14 includes an evaluate input, in some embodiments some of the dynamic logic circuits may not include an evaluate input (i.e. they may evaluate in response to inputs being asserted). It is still further noted that, while the clock buffer circuit 170 is conditional in this embodiment, in other embodiments the clock buffer may not be conditional, if desired.

It is noted that, while specific logic circuits 174, 176, and 172 are shown in FIG. 16, other embodiments may use other logic circuits, which may be dependent on the definition of asserted for the input signals. Additionally, any Boolean equivalents of the illustrated logic may be used.

It is noted that the precharge phase and the evaluate phase have been described above as being phases of the clock signal. However, it is contemplated that the precharge phase and the evaluate phase may be derived from the phases of the clock signal. The precharge phase may be shorter or longer than the corresponding clock phase, as may the evaluate phase, as desired. Thus, precharge of the dynamic logic circuits may be responsive to a clock phase, and evaluate may be responsive to a clock phase.

In the illustrated embodiment, the transistor T14 may be an NMOS transistor, although other transistor types may be used in other embodiments.

Figure 17:
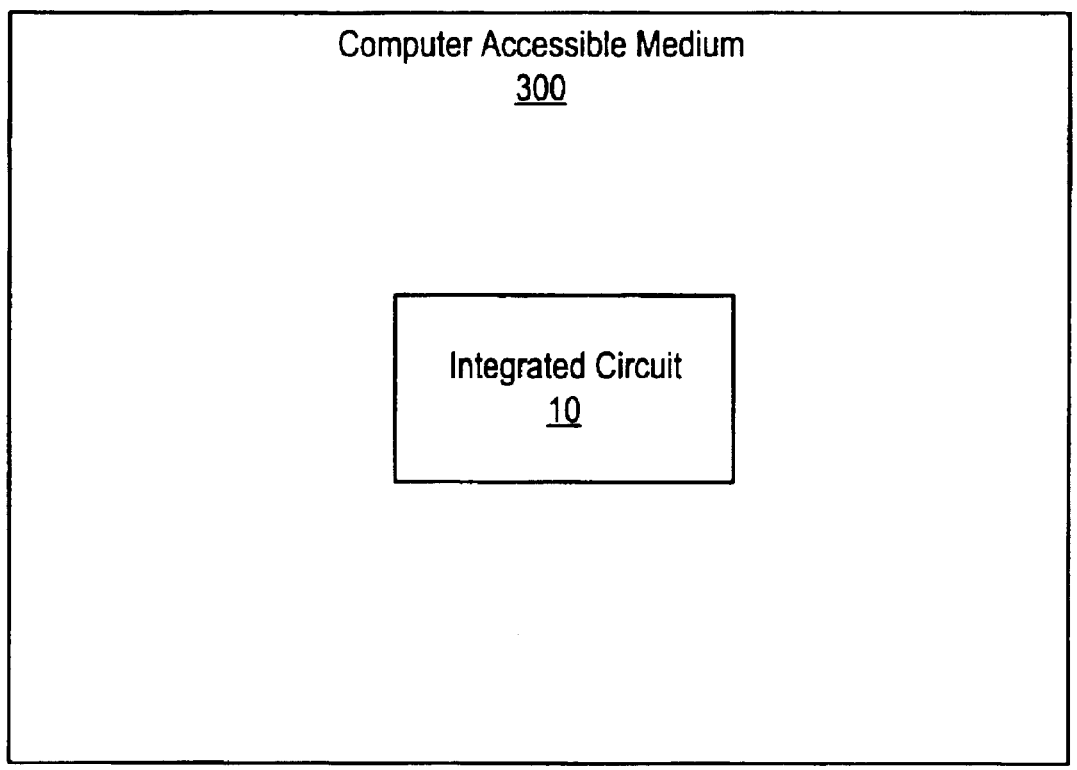
FIG. 17 is a block diagram of one embodiment of a computer accessible medium.

Turning next to FIG. 17, a block diagram of a computer accessible medium 300 including one or more data structures representative of the integrated circuit 10 (e.g. the embodiments shown in FIGS. 1 and/or 6) is shown. Generally speaking, a computer accessible medium may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Generally, the data structure(s) of the circuitry carried on the computer accessible medium 300 may be read by a program and used, directly or indirectly, to fabricate the hardware comprising the circuitry. For example, the data structure(s) may include one or more behavioral-level descriptions or register-transfer level (RTL) descriptions of the hardware functionality in a high level design language (HDL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium 300 may be the netlist(s) (with or without the synthesis library) or the data set(s), as desired. In yet another alternative, the data structures may comprise the output of a schematic program, or netlist(s) or data set(s) derived therefrom.

While computer accessible medium 300 carries a representation of the integrated circuit 10, other embodiments may carry a representation of any portion of the dynamic integrated circuit 10 as shown in any of the above figures (or any combination of the above figures).

Numerous variations and modifications will become apparent to those skilled in the art once the above disclosure is fully appreciated. It is intended that the following claims be interpreted to embrace all such variations and modifications.

What is claimed is:

1. An integrated circuit comprising:
    a static logic scan circuit coupled to receive a scan mode signal to control whether or not scan is active and a scan clock signal to clock scan when scan is active, wherein the static logic scan circuit is coupled between an output of a first static storage device which receives a scan-in signal and a scan-in input of a second static storage device, in which the first and second static storage devices are clocked by the scan clock signal scan, the static logic scan circuit to prevent a race condition from the first static storage device and the second static storage device responsive to the scan mode signal indicating that scan is active, and the static logic scan circuit to use the scan mode signal to deactivate a first passgate to prevent toggling of the static logic scan circuit during non-scan; and
    a dynamic logic scan circuit coupled to receive the scan mode signal, the scan clock signal, and the scan-in signal, wherein the dynamic logic scan circuit is coupled to an internal node of a dynamic logic circuit, and wherein the dynamic logic scan circuit to provide the scan-in signal onto the internal node through a second passgate controlled by the scan clock and to retain the scan-in input on the internal node responsive to the scan clock signal, the dynamic logic scan circuit to also use the scan mode signal to deactivate a third passgate to prevent toggling of the dynamic logic scan circuit during non-scan.

2. The integrated circuit as recited in claim 1 wherein the first passgate circuit is coupled to the output of the first static storage device and a first circuit coupled to receive the scan mode signal and the scan clock signal, in which the first circuit causes the first passgate to be closed responsive to the scan mode signal during non scan.

3. The integrated circuit as recited in claim 2 wherein the static logic scan circuit operates as a scan latch between the first and second static storage devices.

4. The integrated circuit as recited in claim 2 wherein a portion of the dynamic logic scan circuit disposed past the internal node operates as a scan latch to output a scan out signal.

5. A circuit comprising:
    a dynamic logic circuit having an internal node in which the internal node generates a dynamic signal in response to a dynamic input signal to the dynamic logic circuit, the internal node coupled to an output circuit to generate an output signal from the dynamic logic circuit on an output node; and
    a dynamic logic scan circuit coupled to receive a scan mode signal to activate scan, a scan clock signal to clock scan when scan is active and a scan-in signal for scan input, wherein the scan-in signal to the dynamic logic scan circuit is coupled to the internal node through a first passgate controlled by the scan clock and to retain the scan-in signal on the internal node responsive to the scan clock signal, the dynamic logic scan circuit to use the scan mode signal to deactivate a second passgate to prevent toggling of the dynamic logic scan circuit during non-scan.

6. The circuit as recited in claim 5, wherein
    the dynamic logic circuit includes a first transistor having its gate coupled to the output node, a first node coupled to the internal node, and a second node coupled to a power supply; and
    the dynamic logic scan circuit includes a second transistor and a third transistor coupled in series to the internal node, wherein a gate of the second transistor is coupled to the output node and a gate of the third transistor is controlled by the scan mode signal and the scan clock signal.

7. The circuit as recited in claim 6 wherein a portion of the dynamic logic scan circuit disposed past the internal node operates as a scan latch to output a scan out signal.

8. The circuit as recited in claim 7 wherein the third transistor is activated responsive to the scan mode signal indicating that scan is active, and wherein the second transistor cooperates with the first transistor to retain a value on the internal node responsive to the third transistor being active.

9. The circuit as recited in claim 8 wherein the third transistor is deactivated responsive to the scan mode signal indicating non-scan and wherein the third transistor to prevents the second transistor from actively retaining the value when the third transistor is deactivated.

10. The circuit as recited in claim 6 wherein the second transistor and the third transistor are coupled between the internal node and a supply return.

11. A method comprising:
    providing a scan mode signal and a scan clock signal to control scan operation of both static logic scan circuitry and dynamic logic scan circuitry;
    asserting the scan mode signal during scan to activate the static logic scan circuitry and the dynamic logic scan circuitry and asserting the scan clock signal to provide clocking for scan operations;
    coupling a scan-in signal to an input latch of a static logic to perform static scan;
    asserting the scan clock signal to couple the scan-in signal past an input passgate of the dynamic logic scan circuitry;
    performing scan on static and dynamic logic in which only two scan specific signals, the scan mode signal and the scan clock signal, are used; and
    deasserting the scan mode signal to deactivate a passgate in each of the static logic scan circuitry and the dynamic logic scan circuitry to prevent toggling of the static logic scan circuitry and the dynamic logic scan circuitry during non-scan.

12. The method as recited in claim 11 further comprising preventing a race condition between the input latch and an output latch of the static logic by operating the static logic scan circuitry as a latch.

13. The method as recited in claim 11 further comprising retaining a value on an internal node of the dynamic logic using the dynamic logic scan circuitry.

14. The method as recited in claim 13 further comprising coupling the scan-in signal past the input passgate to an internal node of the dynamic logic.

* * * * *